(12) United States Patent
Muehlberger et al.

(10) Patent No.: US 9,341,807 B2
(45) Date of Patent: May 17, 2016

(54) GRAVITATION COMPENSATION FOR OPTICAL ELEMENTS IN PROJECTION EXPOSURE APPARATUSES

(71) Applicant: Carl Zeiss SMT GmbH, Oberkochen (DE)

(72) Inventors: Norbert Muehlberger, Aalen-Ebnat (DE); Thorsten Rassel, Huettlingen (DE); Armin Schoeppach, Aalen (DE); Juergen Fischer, Heidenheim (DE); Matthias Orth, Neresheim-Elchingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/484,696

(22) Filed: Sep. 12, 2014

(65) Prior Publication Data
US 2015/0009557 A1 Jan. 8, 2015

Related U.S. Application Data

(60) Division of application No. 13/111,492, filed on May 19, 2011, now Pat. No. 8,854,603, which is a continuation of application No. PCT/EP2009/066917, filed on Dec. 11, 2009.

(30) Foreign Application Priority Data

Dec. 11, 2008 (DE) .......................... 10 2008 054 550

(51) Int. Cl.
*G03B 27/42* (2006.01)
*G03B 27/54* (2006.01)
(Continued)

(52) U.S. Cl.
CPC .............. *G02B 7/001* (2013.01); *G02B 13/143* (2013.01); *G02B 13/16* (2013.01); *G03F 7/70825* (2013.01)

(58) Field of Classification Search
CPC ........................ G03F 7/70825; G02B 13/143
USPC ........... 355/52, 53, 55, 67; 359/813, 819–822
See application file for complete search history.

(56) References Cited

U.S. PATENT DOCUMENTS

| 5,780,943 A | 7/1998 | Ono |
| 6,218,751 B1 | 4/2001 | Bohlin |

(Continued)

FOREIGN PATENT DOCUMENTS

| DE | 10 053 899 A1 | 5/2002 |
| DE | 101 40 608 A1 | 3/2003 |

(Continued)

OTHER PUBLICATIONS

International Search Report for the corresponding PCT Application No. PCT/EP2009/066917, mailed Mar. 19, 2010.

(Continued)

*Primary Examiner* — Hung Henry Nguyen
(74) *Attorney, Agent, or Firm* — Fish & Richardson P.C.

(57) ABSTRACT

A gravitation compensator for mounting optical elements in a projection exposure apparatus and a corresponding projection exposure apparatus are disclosed. The gravitation compensator at least partly compensates for the weight force of a mounted optical element and simultaneously enables a change in the position of the optical element without the compensated weight force being altered in an impermissible manner during the change in position. This applies, in particular, to high weight forces which are to be compensated. Furthermore, the gravitation compensator enables use in different atmospheres and the compensation of corresponding aging effects.

32 Claims, 14 Drawing Sheets

(51) Int. Cl.
  *G02B 7/00*   (2006.01)
  *G03F 7/20*   (2006.01)
  *G02B 13/14*  (2006.01)
  *G02B 13/16*  (2006.01)

(56) References Cited

U.S. PATENT DOCUMENTS

| | | |
|---|---|---|
| 6,788,386 B2 | 9/2004 | Cox et al. |
| 7,046,335 B2 | 5/2006 | Miyajima |
| 7,154,684 B2 | 12/2006 | Shibazaki |
| 7,193,794 B2 | 3/2007 | Beck et al. |
| 7,426,013 B2 | 9/2008 | Miyajima |
| 7,564,636 B2 * | 7/2009 | Zengerling ......... G03F 7/70825 359/811 |
| 8,199,315 B2 | 6/2012 | Rief |
| 8,416,386 B2 | 4/2013 | Margeson et al. |
| 8,854,603 B2 | 10/2014 | Muehlberger et al. |
| 2002/0085291 A1 | 7/2002 | Diecker |
| 2003/0197914 A1 | 10/2003 | Cox et al. |
| 2004/0207826 A1 | 10/2004 | Miyajima |
| 2004/0212794 A1 | 10/2004 | Mizuno |
| 2006/0262413 A1 | 11/2006 | Miyajima |
| 2008/0285002 A1 | 11/2008 | Rief |
| 2009/0185148 A1 | 7/2009 | Kwan et al. |
| 2009/0207396 A1 | 8/2009 | Melzer et al. |
| 2011/0267596 A1 | 11/2011 | Muehlberger et al. |

FOREIGN PATENT DOCUMENTS

| | | |
|---|---|---|
| DE | 10 339 362 A1 | 3/2005 |
| DE | 69825747 T2 | 9/2005 |
| DE | 10 2005 057 860 A1 | 6/2007 |
| DE | 60 126 103 T2 | 11/2007 |
| DE | 10 2006 038 455 A1 | 2/2008 |
| EP | 1 32 1823 A2 | 6/2003 |
| EP | 1 475 669 A1 | 11/2004 |
| EP | 1 503 246 A2 | 2/2005 |
| EP | 1 720 068 A1 | 11/2006 |
| JP | 55-060719 A | 5/1980 |
| JP | 58-137618 A | 8/1983 |
| JP | 09-275069 A | 10/1997 |
| JP | 2000-306981 A | 11/2000 |
| JP | 2001-284438 A | 10/2001 |
| JP | 2003-203860 A | 7/2003 |
| JP | 2004-281654 A | 10/2004 |
| JP | 2004-319682 A | 11/2004 |
| JP | 2005-140185 A | 6/2005 |
| JP | 2009-545152 A | 12/2009 |
| WO | WO 2006/087463 A1 | 8/2006 |
| WO | WO 2006/120927 | 11/2006 |
| WO | WO 2007/010011 A2 | 1/2007 |
| WO | WO 2008/012336 A1 | 1/2008 |
| WO | WO 2008/122313 A1 | 10/2008 |
| WO | WO 2009/093907 | 7/2009 |

OTHER PUBLICATIONS

English translation of German Office Action for corresponding DE Application No. 10 2008 054 550.3-51, dated Jul. 22, 2009.

Japanese Office Action, with translation thereof, for JP Appl No. 2011-540118, dated Dec. 18, 2013.

* cited by examiner

GRAVITATION COMPENSATION FOR OPTICAL ELEMENTS IN PROJECTION EXPOSURE APPARATUSES

CROSS-REFERENCE TO RELATED APPLICATIONS

This application is a divisional of, and claims benefit under 35 USC 120 to, U.S. application Ser. No. 13/111,492, filed May 19, 2011, now U.S. Pat. No. 8,854,603, which is a continuation of, and claims benefit under 35 USC 120 to, international application PCT/EP2009/066917, filed Dec. 11, 2009, which claims benefit under 35 USC 119 of German Application No. 10 2008 054 550.3, filed Dec. 11, 2008. U.S. application Ser. No. 13/111,492 and international application PCT/EP2009/066917 are hereby incorporated by reference in their entirety.

FIELD

The present disclosure relates to a gravitation compensator for compensating for the weight force of optical elements in a projection exposure apparatus or for mounting the optical elements, and also to a corresponding projection exposure apparatus and a method for operating both the compensator and the projection exposure apparatus.

BACKGROUND

In modern projection exposure apparatuses for microlithography for the production of extremely small structures in the field of electrical engineering or micromechanics, such as, in particular, EUV (extreme ultraviolet) projection exposure apparatuses which are operated with extreme ultraviolet light, optical elements which have to be positioned correspondingly exactly are desirable. In particular, it may be desirable to alter the position of the corresponding optical elements, such that actuators have to be provided which enable the changes in position of the optical elements such as, in particular, of mirrors in EUV projection exposure apparatuses. Such projection exposure apparatuses including actuators for changing the position of optical elements are described in DE 102006 038455 A1, WO 2008/122313 A1, DE 102005 057860 A1, DE 60126103 T2, DE 10339362 A1, DE 10140608 A1, DE 10053899 A1, WO 2008/012336 A1, EP 1503246 A2, EP 1720068 A1, U.S. Pat. No. 7,046,335 B2, EP 1321823 A2, WO 2007/010011 A2.

On account of the size and weight of the optical elements to be positioned, it may be desirable to use gravitation compensators which compensate for the weight force of the corresponding optical elements, such that, during the movement of the optical elements, the actuators do not simultaneously have to bear the entire supporting load. As a result, the actuation of the optical elements by the actuators is simplified and a lower energy input into the actuators is desirable. This in turn has positive effects on the overall behavior of the projection exposure apparatus, since, by way of example, no additional thermal loads are introduced into the apparatus on account of the high energy consumption of the actuators. Such gravitation compensators are described e.g. in EP 1475669 A1 and WO 2009/093907 A1. Furthermore, magnetic bearing devices are known from DE 69825747 T2, US 2004/0212794 A1, WO 2006/087463 A1, JP 55060719 A and JP 58137618 A.

However, the movement of the optical elements as a result of the actuation of the actuators has the effect that the gravitation compensators also enable a corresponding movement. Particularly in the case of large and heavy optical elements such as, for example, corresponding mirrors in EUV projection exposure apparatuses, this can lead to problems, however, on account of the high compensation forces or compensation loads.

In previous gravitation compensators it has been ascertained, in particular, that the positioning accuracy of the optical elements can be impaired when gravitation compensators are used, and that the positioning accuracy can be disadvantageously influenced particularly in specific atmospheres that are used in EUV projection exposure apparatuses, such as hydrogen-containing atmospheres. The positioning stability over a relatively long period of time can also be adversely affected.

SUMMARY

The present disclosure provides gravitation compensators for the compensation of the gravity of optical elements or for mounting optical elements in projection exposure apparatuses for microlithography which do not have the disadvantages mentioned above.

The present disclosure provides gravitation compensators for use in a projection exposure apparatus and also corresponding projection exposure apparatuses in which the positioning accuracy of the optical elements is not adversely influenced by the gravitation compensators and the positional stability can be maintained for a long period of time even in an unfavorable atmosphere, e.g. in hydrogen-containing atmospheres.

In some embodiments, a gravitation compensator for mounting optical elements in a projection exposure apparatus, in conjunction with at least partial compensation of the weight force of a mounted optical element, simultaneously enables a change in the position of the optical element. The compensated weight force remains approximately constant during the change in position and, in the case of compensated weight forces of $\geq 100$ N or even $\geq 200$ N, the change in the compensated force in the case of a change in position of $\geq 250$ μm and/or mounting in predominantly hydrogen-containing atmospheres and/or over mounted times of $\geq 10$ h is less than or equal to 0.5 N. Optionally but not necessarily, the compensated weight force is $\geq 250$ N or $\geq 300$ N and the change in position is $\geq 500$ μm or $\geq 750$ μm. In this case, the change in the compensated force can be $\leq 0.2$ N or $\leq 0.1$ N. Approximately constant should be understood to mean that the force-distance characteristic curve of the gravitation compensator, in the case of changes in position of less than 250 μm, such as of less than 500 μm around an equilibrium position, deviates by less than 0.25% of the force value in the equilibrium position.

In one embodiment of the disclosure, the gravitation compensator includes at least two magnetic compensator elements having different force-distance characteristic curves which are arranged one behind another and/or alongside one another. A further embodiment of the disclosure of a gravitation compensator for mounting optical elements in a projection exposure apparatus includes at least one first magnetic compensator element, wherein at least one second magnetic compensator element having a different force-distance characteristic curve than the first magnetic compensator element is arranged in series and/or in parallel with or in an angular fashion alongside the first magnetic compensator element. In this case, in one embodiment, the first and the second magnetic compensator element, in the case of series connection, can be connected by a rigid, non-magnetic coupling, wherein at least one flux guiding element or ferromagnetic flux guiding element can be provided in the region between the magnetic compensator elements.

What is achieved by the rigid, non-magnetic coupling and the flux guiding element is that the two compensator elements influence one another as little as possible with regard to their respective force-distance characteristic curves such that the latter changes for the respective compensator on account of the presence of the other compensator. The resulting force-distance characteristic curve of the two compensator elements that are arranged in series and/or in parallel or in angular fashion alongside one another and are mechanically coupled to one another can thereby be represented to a very good approximation as the sum of the individual force-distance characteristic curves. The dimensioning processes of the compensators are greatly simplified, for example, as a result of such measures.

In one embodiment of the disclosure, the gravitation compensator includes at least one mechanical spring element as a compensator element, wherein the at least one mechanical spring element and the at least one magnetic compensator element can be coordinated with one another by their force-distance characteristic curves such that, over a predetermined distance range, the compensation force is constant on a technical scale, e.g. better than 0.25%.

In one embodiment of the disclosure, the gravitation compensator for mounting optical elements in a projection exposure apparatus includes at least one first magnetic compensator element, wherein the gravitation compensator includes at least one mechanical spring element as compensator element, and wherein the mechanical spring element or elements and the at least one magnetic compensator are coordinated with one another by their force-distance characteristic curves such that, over a predetermined distance range, the compensation force is constant on a technical scale. Optionally, but not necessarily, the mechanical spring element includes a spring having a linear force-distance characteristic curve, or the mechanical spring element includes a spring having at least one approximately constant range in the force-distance characteristic curve. Such a spring element can be a buckling bar, for example, which is also designated as a buckling spring.

In one embodiment of the disclosure, the gravitation compensator according to one of the embodiments described above includes a magnetic compensator element having at least two inner magnets and at least one outer magnet, wherein at least one of the inner magnets can be altered with respect to the other inner magnet with regard to the spatial position and/or the magnetic strength is adjustable. Furthermore, in the case of a gravitation compensator according to one of the embodiments described above, at least one of the magnets of a magnetic compensator element can be arranged in a manner separated from the atmosphere present in the vicinity of the gravitation compensator, wherein e.g. the separation can be realized by a gas-tight encapsulation, a gas-tight coating and/or a gas purging system. Optionally, a gravitation compensator according to one of the embodiments described above can include at least one exchangeable adjusting element which influences the magnetic field.

Further embodiments of the gravitation compensator according to the disclosure include, as an alternative or in addition to the features already described above, at least one compensator element including at least one counterweight which is connected via at least one deflection element to the optical element to be mounted, wherein the deflection element can include at least one solid articulation or at least one cable pull with a roller.

Further embodiments of the gravitation compensator according to the disclosure include, as an alternative or in addition to the features already described above, at least one compensator element which is assigned at least one positioning element which can bring about, independently of the compensator element, a change in the position of the optical element to be mounted.

The present disclosure therefore also includes a projection exposure apparatus for microlithography including at least one gravitation compensator according to an embodiment described above. In this case, the microlithographic projection exposure apparatus can include a gas purging device which circulates gas around the region of the gravitation compensator or gravitation compensators in order to set a predefined atmosphere, wherein the gas purging device can be established in such a way that a different gas atmosphere than the rest or other parts of the projection exposure apparatus can be set in the region of a gravitation compensator.

Furthermore, the disclosure includes a method for operating a gravitation compensator, or respectively a projection exposure apparatus, wherein at least one gravitation compensator, or respectively a projection exposure apparatus, including the features described above is provided and at least one optical element is mounted with the gravitation compensator.

The disclosure is based on the insight that it is desirable for the gravitation compensator to keep the compensation force largely stable even in the case of relatively large changes in position and relatively large weight forces to be compensated for, such that the actuators, or the rest of the bearing construction, are not adversely influenced by an unexpected change in the load to be supported on account of the change in gravitation compensation. This also applies to changes in the compensation force on account of ambient influences and/or as a result of aging. As a result, in particular, a possible deformation of the mounted optical elements, such as e.g. mirrors in EUV projection exposure apparatuses, in particular within the EUV projection objective, as a result of an (unexpected) change in the load to be supported on account of the change in gravitation compensation is also avoided, or very greatly reduced, whereby the dimensional accuracy of the optical element substantially is also maintained e.g. during adjustment and/or positioning. In some EUV mirrors, the dimensional accuracy is better than 0.1 nm over a range of more than 10 cm.

Correspondingly, as explained above, a gravitation compensator is proposed which, in the case of weight forces to be compensated for of ≥100 N (e.g., ≥200 N, ≥250 N, ≥300 N), both in the case of, in particular, linear change in position of the element to be mounted, that is to say of the optical element, of ≥250 µm (e.g., ≥500 µm, ≥750 µm), along a spatial direction and/or in the case of mounting in predominantly hydrogen-containing atmospheres and/or over mounting times of ≥10 hours (e.g., ≥20 hours, ≥100 hours), has changes in the compensated force in the range of ≤0.5 N (e.g., ≤0.2 N, ≤0.1 N). As long as these limits of the change in the compensated force are complied with, the rest of the bearing constructions and/or the actuators can accommodate these changes without the positioning accuracy, the dimensional accuracy of the optical element, or the within the tolerance ranges applicable for projection exposure apparatuses being influenced in an excessively disadvantageous manner.

During the tracking of the gravitation compensators for compensating for the change in the position of the optical elements that is brought about by the actuators, a change in the compensation load or the compensation force can occur, for example. This change in force, or force variance, is disadvantageous since it can lead to overloading of the actuators, which in turn adversely influences the positioning accuracy and can additionally jeopardize compliance with the dimensional accuracy in the event of position change. It is therefore endeavored to use gravitation compensators in which no appreciable change in the compensation force occurs particularly in the case of high gravitational forces to be compensated for over a largest possible movement range of the element to be mounted, that is to say the optical element. A corresponding stability of the compensation force is also sought over long bearing times, particularly in corresponding atmospheres of the projection exposure apparatuses. This advantageously also ensures that possible mirror deformations, or generally deformations of the (optical) element to be held, are likewise in an acceptable tolerance range.

Such a gravitation compensator which can fulfill the above-indicated specification found as a prerequisite for sufficient positioning accuracy can be realized e.g. by the different configuration variants described above.

According to a first aspect, a gravitation compensator can be provided in which at least two magnetic compensator elements having different force-distance characteristic curves are arranged in series and/or in parallel with one another or in angular fashion alongside one another.

With the combination of compensator elements having different force-distance characteristic curves which specify the change in the compensation force with change in the position of the element to be mounted, the limit values specified above can be achieved by correspondingly skillful combination of the compensator elements.

Although this holds true for the combination of any desired compensator elements, the combination of magnetic compensation elements or compensator elements is particularly preferred since magnetic gravitation compensators, by virtue of their structural construction have, in principle, a very good constancy of the compensation force over a wide range of the positioning change, wherein, in particular, a large range of the load to be compensated for can be covered. The properties of the magnetic compensator elements can be improved and optimized even further with a combination of two or more magnetic compensator elements. In particular, the force-distance characteristic curve of the gravitation compensator including a plurality of magnetic compensation elements can be better adapted to the desired properties, such as e.g. that the force-distance characteristic curve has over a predetermined distance, i.e. over a predetermined displacement of the optical element, a virtually constant force lying in the tolerance range of the data specified above. This results in a very low bearing stiffness of the gravitation compensator in the direction of the predetermined displacement, which usually coincides with the direction of the gravitation force to be compensated for.

Magnetic compensators can be constructed in such a way that two magnetically identically oriented magnets are arranged at a distance from one another along an axis. In the central region of this axial magnet arrangement, an outer circumferential magnetic ring is provided, which at least partly encloses the inner magnets. The outer magnetic ring is magnetically oriented transversely with respect to the inner magnets, such that the inner pole of the outer magnet is adjacent to a like pole of the first inner magnet and to an opposite pole of the second inner magnet. This results in a magnetic force along the longitudinal axis between the inner and outer magnets which remains virtually constant despite relative displacement of the outer magnet with respect to the inner magnets in a wide displacement range. The magnetic force can be utilized as a compensation force. A further advantage of the use of identically oriented inner magnets arranged at a distance from one another along an axis is that, in the case of an approximately symmetrical positioning of the magnets relative to the outer magnetic ring, a maximum force is generated which can be used e.g. as a supporting force for mounting an optical element. In the case of the use of two oppositely oriented inner magnets, in the symmetrical positioning mentioned, the force zero would be generated, such that in this position no supporting force would be present. The latter was arise only in the case of significant relative displacement of the oppositely oriented inner magnets with respect to the outer magnetic ring, as a result of which, disadvantageously, the structural space is enlarged and furthermore, with the use of identical magnet dimensions, the supporting force is significantly reduced in comparison with identically oriented magnets. Further advantages and disadvantages of these two embodiment variants of the magnetic compensator elements just described are described in connection with the exemplary embodiments.

For the combination of magnetic compensators, a first and a second magnetic compensator element and/or further compensator elements can be connected in series in a series connection, wherein they can be connected to one another e.g. via a rigid, non-magnetic coupling. In this case, series connection should be understood to mean connection, e.g. mechanical connection, of the movable parts of the magnetic compensators (also designated hereinafter as armatures), such that the latter substantially perform a common movement. The non-magnetic coupling has the already described advantage that the respective force-distance characteristic curve of the individual magnetic compensator element is influenced as little as possible by the presence of the other magnetic compensator element. In order to reduce such influencing further, in the region between the magnetic compensator elements it is possible to provide flux guiding elements, in particular ferromagnetic flux guiding elements, which can prevent the short circuit between the magnetic compensator elements and influence the magnetic fields in a desired manner.

Alongside the combination of magnetic compensator elements, additional or alternatively also mechanical compensator elements in the form of spring elements can be used, whether in addition to the combination of magnetic compensator elements or as combination with a single magnetic compensator element. Combinations of a plurality of mechanical compensator elements such as, for example, spring elements with one or more magnetic compensator elements are also conceivable. What is essential here, too, is that the force-distance characteristic curves are coordinated with one another such that, over a predetermined distance range, that is to say a corresponding change in the position of the optical element to be mounted, the compensation force remains constant or virtually constant. Here, in particular a technical scale should be assumed, i.e. a constancy lying within the tolerance range for the positioning accuracy that is typically to be achieved for projection exposure apparatuses.

A mechanical spring element which can be used as a mechanical compensator element can be a spring having a linear force-distance characteristic curve in accordance with Hooke's law, or a spring element having at least one approximately constant range with regard to the force profile in the force-distance characteristic curve.

Such a mechanical spring element can then also be used by itself as a gravitation compensator. One possible mechanical element is an elastic buckling bar which is used in a specific range of the flexure in which the force-distance characteristic curve enables a constancy or virtually constancy of the compensation force for the position changes sought, i.e. the corresponding flexures of the buckling rod.

The magnetic compensator elements or magnetic gravitation compensators can be designed such that they are adjustable or can be altered. By way of example, the position of at least one magnet, in particular of one of the inner magnets, can be able to be altered with regard to the spatial position, e.g. with respect to the other inner magnet, and/or the magnetic strength, i.e. the magnetic field strength or the magnetic flux, of at least one magnet, in particular of one of the inner magnets, can be adjustable. This can be achieved, for example, by a yoke with a coil being arranged at the corresponding magnets, such that the magnetic field strength or the magnetic flux can be altered via electric current correspondingly being applied to the coil.

For magnetic compensator elements or magnetic gravitation compensators, in particular, an exchangeable adjusting element which influences the magnetic field can also be provided, such as, for example, ferromagnetic elements which can be brought into the corresponding vicinity of the magnets of the magnetic compensator.

By virtue of the adjustability or variability of the gravitation compensators or the corresponding compensator elements, it is possible to counteract changes in the compensation force by adapted setting, such that positional changes or aging phenomena or environmental influences become non-critical. In particular, with corresponding sensors, it is also possible to install a control circuit that enables automatic control (regulation) with feedback in the control circuit.

In order to obtain the corresponding constancy with regard to the influence of the surrounding atmosphere, it is possible, particularly for magnetic compensator elements, to provide for the magnets of the magnetic compensator element to be arranged in a manner separated from the atmosphere present in the vicinity of the gravitation compensator.

In this case, the separation can be realized by a gas-tight encapsulation, a gas-tight coating and/or a corresponding gas purging system, wherein, in the case of the gas purging system, non-critical, for example inert, gas can be used, which circulates around the compensator element, such that the harmful atmosphere otherwise present is driven out of the region around the gravitation compensator.

Alongside magnetic compensators, mechanical gravitation compensators are also conceivable which, for example, have at least one counterweight which is connected via at least one deflection element to the optical element to be mounted, such that the counterweight and the weight of the optical element mutually cancel each other out.

In this case, examples of appropriate deflection elements include solid articulations or cable pulls with corresponding rollers or the like.

As a further possibility for restricting the influence of the change in position on the force to be compensated for consists in minimizing the change in position for the compensator element or for the gravitation compensator. Accordingly, a positioning element can be provided which contributes to the fact that that optical element to be mounted can be changed in its position, without the compensator element having to compensate for this change in position. Accordingly, the positioning element can support the change in position independently of the compensator element.

A further aspect of the present disclosure involves, with regard to the above insight that the gravitation compensator is intended to keep the compensation force largely stable, i.e. constant, even in the case of relatively large changes in position and relatively large weight forces to be compensated for, attaining the insight by virtue of the fact that possible guide mechanisms can advantageously be used for reducing the bearing stiffness of the weight force or gravitation compensator. Guide mechanisms should be understood as technical embodiments which allow the weight force compensator, in the case of movements of a compensation element or of a part of a compensation element in the direction of the force to be compensated for, to experience guidance of this moved element perpendicularly to the direction, in order to reduce movements perpendicular to the direction to a minimum. This is of importance particularly in the case of the mounting of EUV mirrors in EUV projection exposure apparatuses by gravitation compensators, since the EUV mirrors can thereby be positioned more precisely by additional actuators.

Therefore, the present disclosure additionally includes a weight force compensator for mounting optical elements and for compensating for a force F which acts in a direction z and is applied to a force application point in a microlithographic projection exposure apparatus. Optionally, the direction z is chosen in the direction of the gravitation force of the optical element. The force applied to a force application point includes at least one part of the weight force of the optical element or is formed by the weight force or a part thereof. The weight force compensator according to the disclosure furthermore includes an armature of a compensation element, the armature being movable in the direction z of the force line of the force F and encompassing the force application point, the compensation element having a first force-distance characteristic curve in the direction z of the force F. In this case, the armature can consist of a movable magnetic or magnetized material, such as a permanent magnet, for example, or it can include such a material. The armature can furthermore consist by a movable spring or generally an elastic element which permits a movement of the force application point at least in the direction of the force, or it can include such an element. In this case, the elastic element can be e.g. a spring having a linear force-distance characteristic curve, or alternatively a buckling spring or a buckling bar having a force-distance characteristic curve which has, in at least one distance range, a gradient deviating from other distance ranges, optionally a reduced gradient, i.e. a flat profile. The weight force compensator according to the disclosure additionally has a first bearing stiffness S1 of the compensation element, given by the quotient of the difference $\Delta FF1$ between a maximum and a minimum force of a first force interval $\Delta F1$ including the force F and the absolute value of a first distance interval $\Delta z1$—assigned to the first force interval $\Delta F1$ by way of the first force-distance characteristic curve—around a first point z0, to which the force F is assigned by way of the first force-distance characteristic curve. In this case, the bearing stiffness generally characterizes the possible maximum change in force which, by the weight force compensator, acts on the optical element in the case of a positional displacement of the optical element. Ideally, the change in force should be zero in order to input parasitic forces or torques onto the optical element via the force application point as little as possible. Deformation of the optical element in the case of the positional displacement thereof is thus avoided.

The weight force compensator according to the disclosure can include additionally guide mechanisms with a second force-distance characteristic curve in the direction of the force F for guiding the armature of the compensation element and with a second bearing stiffness S2, given by the quotient of the difference $\Delta FF2$ between a maximum and a minimum force of a second force interval $\Delta F2$—assigned by the second force-distance characteristic curve by the first distance interval $\Delta z1$ around the first point z0—and the absolute value of the first distance interval $\Delta z1$. With the presence of such guide mechanisms it is ensured that the armature is substantially restricted to one degree of freedom of movement in the direction of the force to be compensated for, and movements e.g. in the direction perpendicular to the force are prevented. Furthermore, in this case, the force of the force compensator results from the addition of the forces from the first and from the second force-distance characteristic curve. In this case, the addition of forces results in a resulting force-distance characteristic curve and the weight force compensator has a third bearing stiffness S3, which results as the quotient of the difference ΔFF3 between a maximum and a minimum force of at least one third force interval ΔF3 including the force F and the absolute value of the first distance interval Δz1 around at least one point z0*, wherein the at least one third force interval ΔF3 is defined by the resulting force-distance characteristic curve by the first distance interval Δz1 around the at least one point z0* and, in this case, the at least one point z0* is assigned to the force F by way of the resulting force-distance characteristic curve. In this case, the weight force compensator according to the disclosure is distinguished by the fact that the bearing stiffness S3 is less than or equal to the bearing stiffness S1 and/or wherein the resulting force-distance characteristic curve has at least two points z0* which are spaced apart from one another by more than the first distance interval Δz1 and/or wherein, in the resulting force-distance characteristic curve, the difference ΔFF1 around the force F is assigned to a distance interval greater than Δz1.

The advantage of the additional weight force compensator described above is that a reduced bearing stiffness is achieved in conjunction with better guidance of the armature. Furthermore, given a suitable design of the first and second force-distance characteristic curves, it is also possible to increase the movement range of the armature and thus of the optical element, wherein the bearing stiffness does not necessarily increase and can even be reduced.

Further embodiments of the additional weight force compensator according to the disclosure are explained below. In this case, in particular for the compensation element and the guide mechanisms it is possible to use the compensator elements and spring elements in connection with the above-described embodiments of the gravitation compensator according to the disclosure the there. Furthermore, features from the above-described embodiments of the gravitation compensator according to the disclosure can be included in the additional embodiments of the weight force compensator according to the disclosure. Generally, the disclosure also encompasses embodiments which result from combination and exchange of features of the above-described gravitation compensators and of the additional weight force compensator according to the disclosure, and also the embodiments thereof described below.

The additional weight force compensator can be designed such that the armature is movable in the direction of the force by a first distance interval Δz1 around the point z0*, wherein the first distance interval Δz1 can be less than 3 mm and greater than 250 µm. Alternatively or additionally, the third bearing stiffness is less than 2 N/mm, such as less than 0.2 N/mm.

Likewise alternatively or additionally, the movement of the armature perpendicular to the force F is restricted by transverse forces generated by the guide mechanisms in the direction perpendicular to the force F to less than 10% of the absolute value of the movement of the armature in the direction of the force. Furthermore, the optical element can be supported at the force application point of the armature directly or indirectly at least partly by a supporting device. In this case, the supporting device generally has a high stiffness in the direction of the force. In this case, the stiffness should be differentiated from the bearing stiffness since the latter, in the simplest case of the elongation stiffness, if e.g. the supporting device is embodied in a bar-type fashion, is determined from the product of the modulus of elasticity of the supporting device and the cross-sectional area of the supporting device. Alongside the elongation stiffness, the supporting device furthermore also has bending and torsional stiffness. The elongation stiffness in the direction of the force can be chosen to be more than 100 times to more than 1000 times the difference ΔFF3, which corresponds to the maximum force variation of the force F in the third force-distance characteristic curve in the case of maximally permissible displacement of the force application point in the direction z, e.g. by the absolute value Δz1. This ensures that a connection that is as rigid as possible prevails between the force application point at the armature of the weight force compensator and the optical element, in order to be able to position the optical element as exactly as possible.

Furthermore, the supporting device has a lower stiffness (elongation stiffness) in a direction perpendicular to the direction of the force F, the guide mechanism in this direction, preferably if the guide mechanism has a stiffness of more than 200 N. Alternatively, the supporting device has a higher stiffness in a direction perpendicular to the direction of the force F than the guide mechanism in this direction, preferably if the guide mechanism has a stiffness of less than 200 N.

Optionally, the optical element is a mirror of a lithographic EUV projection exposure apparatus, wherein the force F is the weight force or part of the weight force of the mirror.

Alternatively or additionally, the additional weight force compensator is designed according to one of the above embodiments such that the compensation element includes at least one element selected from:

compensation elements for a weight force to be compensated for of ≥200 N or ≥300 N;

compensation elements which permit a change in the position of the optical element of ≥500 µm up to 3 mm;

magnetic compensators;

magnetic compensator elements with at least one magnetic compensator element which is arranged in a manner separated from the atmosphere present in the vicinity of the weight force compensator e.g. by gas-tight encapsulation and/or gas-tight coating and/or gas purging;

magnetic compensators with at least one exchangeable adjusting element which influences the magnetic field;

at least two magnetic compensator elements with different force-distance characteristic curves which are arranged one behind another and/or alongside one another;

compensator elements with a first and a second magnetic compensation element which are connected to one another by a rigid and non-magnetic coupling;

magnetic compensation elements with at least one flux guiding element or a ferromagnetic flux guiding element;

magnetic compensators with at least two inner magnets, wherein at least one of the inner magnets can be altered with respect to the other inner magnet with regard to the spatial position and/or the magnetic strength is adjustable;

mechanical compensator elements which follow Hooke's law;

mechanical spring elements with a range of approximately constant force in the force-distance characteristic curve;

compensator elements including actuators;

spring elements;

buckling bars;

compensator elements including at least one counterweight which is connected via at least one deflection element, e.g. a cable pull or a roller, to the optical element to be mounted; and compensator elements with at least one positioning element which enables a change in the position of the optical element to be mounted independently of the compensator element. The advantages set out in connection with the above-described embodiments of the gravitation compensator therefore largely also arise for the additional weight force compensator.

Furthermore, the additional weight force compensator is designed according to one of the above embodiments such that the guide mechanisms alternatively or additionally include at least one element from:

magnetic guide mechanisms;
magnetic guide mechanisms with at least one magnetic guide mechanism which is arranged in a manner separated from the atmosphere present in the vicinity of the weight force compensator e.g. by gas-tight encapsulation and/or gas-tight coating and/or gas purging;
magnetic guide mechanisms with at least one exchangeable adjusting element which influences the magnetic field;
at least two magnetic guide mechanisms with different force-distance characteristic curves which are arranged one behind another and/or alongside one another;
magnetic guide mechanisms with at least two inner magnets, wherein at least one of the inner magnets can be altered with respect to the other inner magnet with regard to the spatial position and/or the magnetic strength is adjustable;
mechanical guide mechanisms which follow Hooke's law;
mechanical spring elements with a range of approximately constant force in the force-distance characteristic curve;
guide mechanisms including actuators;
spring elements;
buckling bars;
membranes;
spring elements or buckling bars or membranes which are mechanically prestressed by forces; and
guide mechanisms with at least one positioning element which enables a change in the position of the optical element to be mounted.

BRIEF DESCRIPTION OF THE FIGURES

Further advantages, characteristics and features of the present disclosure will become clear during the following detailed description of exemplary embodiments with reference to the accompanying drawings, in which, purely schematically.

DETAILED DESCRIPTION

Figure 1:
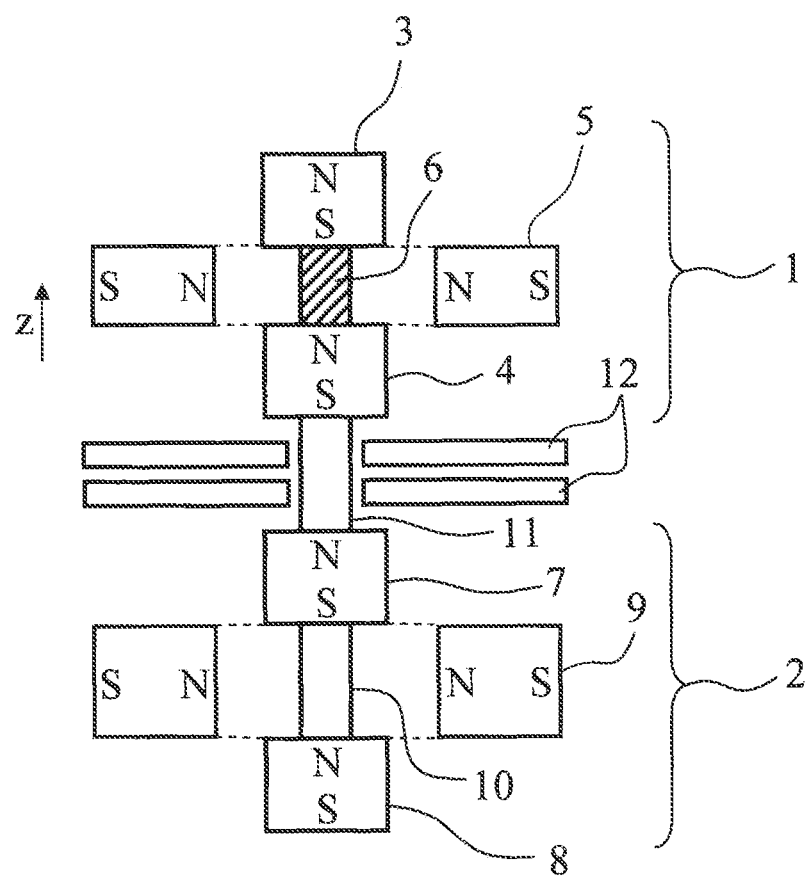
FIG. 1 shows a view of a first embodiment of a gravitation compensator according to the disclosure.

FIG. 1 shows a first embodiment of a gravitation compensator according to the disclosure, including two magnetic compensator elements 1 and 2. Each of the magnetic compensator elements 1, 2 could be used as a dedicated magnetic gravitation compensator.

The magnetic compensator element 1 includes a first inner magnet 3 and also a second inner magnet 4, which, with their magnetic orientation directed identically, are fixedly connected to one another by a stiff connecting element 6. Alongside the inner magnets 3 and 4 there is an outer magnet 5, which is embodied as a magnetic ring and coaxially surrounds the inner magnets 3 and 4. The sectional illustration in FIG. 1 reveals the two sectional areas of the magnetic ring 5 to the left and right of the central mid-axis on which the inner magnets 3 and 4 are arranged.

The orientation of the magnets is such that the magnetic orientation of the outer magnetic ring 5 is oriented transversely with respect to the magnetic orientation of the inner magnets 3 and 4. In the exemplary embodiment shown in FIG. 1, the north poles of the inner magnets 3 and 4 are arranged at the top, while the south poles of the inner magnets 3 and 4 are directed toward the bottom. The magnetic orientation of the outer magnetic ring 5 is set such that the north pole is provided on the inner side of the magnetic ring 5, while the south pole is arranged on the outer side. By virtue of this arrangement, the outer magnetic ring 5 is repelled from the inner magnet 4 along the central longitudinal axis parallel to the connecting element 6, and the outer magnetic ring 5 is attracted in the direction of the inner magnetic ring 3, the attractive force being directed toward the top. Accordingly, this magnetic force or attractive force can be used to compensate for the gravitational force of an element to be mounted, in particular of an optical element (not shown). In this case, the force component directed toward the top remains the same or approximately the same even in the event of a displacement of the outer magnetic ring 5 relative to the inner magnets 3 and 4 in a narrow range since, by way of example, in the case of a displacement in the direction of the z-axis, that is to say parallel to the longitudinal axis of the connecting element 6, a strong attractive force between outer magnet 5 and inner magnet 3 is compensated for by a weaker repulsive force between outer magnet 5 and inner magnet 4. In the exemplary embodiment shown, e.g. an optical element can be supported on the inner magnet 3, wherein the outer magnets 5, 9 are connected to a mount. The inner magnets 3, 4 perform the support of the optical element such that the force generated by the magnets is in equilibrium with the supported weight force of the optical element.

Alternatively, the magnets 3, 4, 7, 9 can be interchanged with regard to their poles such that the polarities of the respective compensator element 1, 2 is respectively opposite to one another within a compensator element. In this case, the inner magnets 3, 4, 7, 8 likewise support the optical element and are movable relative to the outer magnets. Generally, the inner magnets movable relative to the outer magnetic ring and their connecting elements are designated as an armature.

The advantages and disadvantages of the arrangements having different polarities within a magnetic compensator element are explained below with reference to FIGS. 22 to 26.

Figure 22:
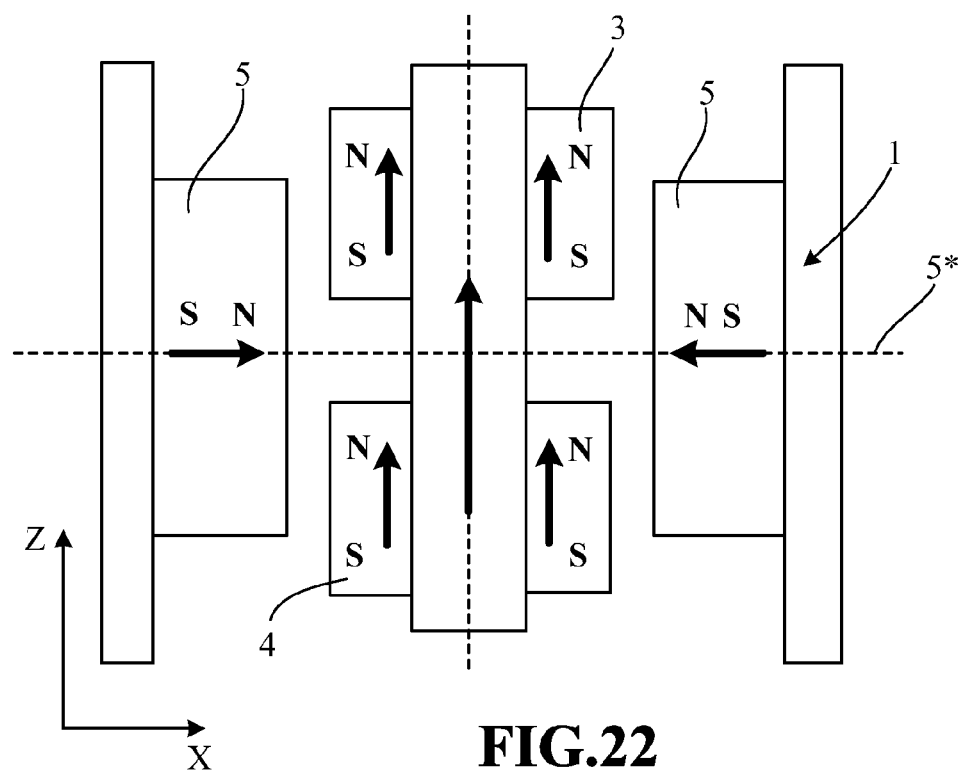
FIG. 22 shows a schematic exemplary embodiment of a magnetic compensator element having two inner magnets arranged with identical polarity.
Figure 23:
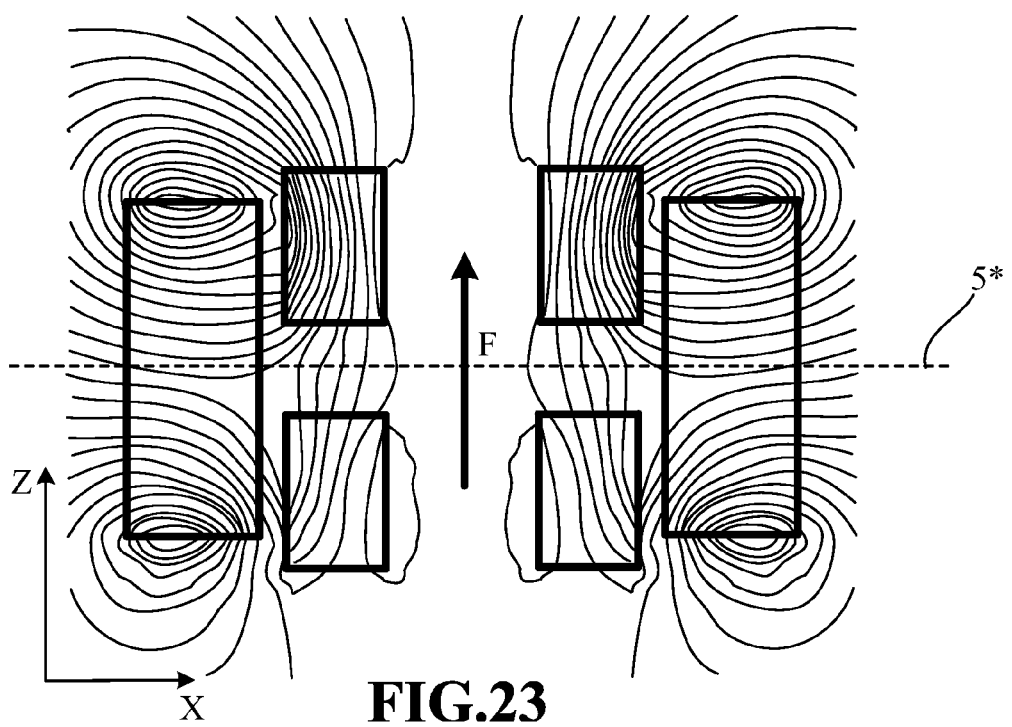
FIG. 23 shows magnetic field characteristic curves of the embodiment according to FIG. 22 in vertical section.

FIG. 22 illustrates a magnetic compensation element 1 corresponding to that from FIG. 1 in a slightly modified and approximately with relationships to scale, with the associated magnetic force line field reproduced in FIG. 23. The inner magnets are polarized in the same direction toward the top (in the positive z-direction). For the armature consisting of the inner magnets 3, 4 and the connecting element 6 this results in a force toward the top in the z-direction. In this case, the effect of the connecting element 6 is evident, which connecting element keeps the inner magnets 3 and 4 at a mutual distance and forms a type of magnetic short circuit between the north pole of the lower and the south pole of the upper inner magnets 3, 4.

Figure 24:
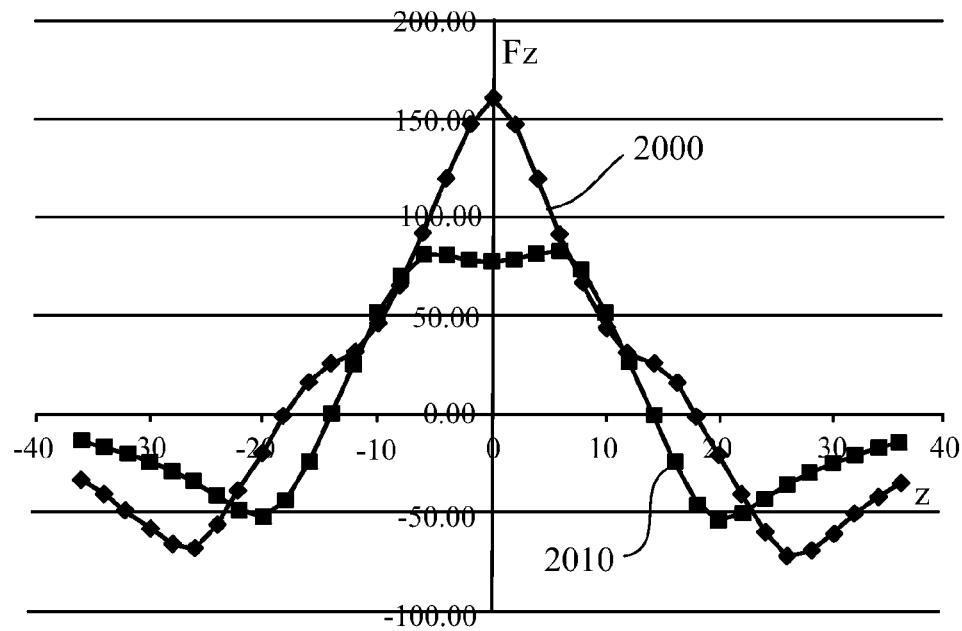
FIG. 24 shows calculated force-distance characteristic curves of a magnetic compensator element having two inner magnets of identical polarity.

FIG. 24 illustrates, for the arrangement according to FIGS. 22 and 23, the force-distance characteristic curve 2000 from table 1 below, which was calculated by the FE method. In this case, the force Fz in the direction z is represented as a function of the armature displacement in z, wherein Steps indicates the computational intervals, Z Pos indicates the z position in millimeters, and Fz in column #1 indicates the force in newtons. The armature displacement is measured relative to a plane of symmetry located in the xy plane through the outer magnet 5, the plane of symmetry being identified by 5* in FIG. 23, and a plane of symmetry of the armature that lies centrally between the two inner magnets 3, 4. It is evident that, in the case of an arrangement of the inner magnets 3, 4 with the same polarity, a force maximum is achieved when the inner magnets are arranged approximately symmetrically with respect to the outer magnet 5. Furthermore, it is evident that the force is directed in the z-direction, that is to say toward the top, and thus forms a maximum supporting force for accommodating an optical element. Furthermore, it is evident that, with increasing displacement toward the top or toward the bottom (in the direction of negative z-values), the force Fz decreases and reaches the value zero in the case of z-displacement of approximately 18 mm. Upon further displacement, the force Fz reverses, that is to say that it acts in the direction of the gravitational force and reaches its maximum with regard to its absolute value at approximately 26 mm. Upon further displacements, the force Fz then tends towards zero. Magnets having a height of 26 mm and a ring thickness of 11 mm and also an external ring diameter of 32 mm for the magnetic ring 5 were taken as a basis for the calculation. The two inner magnets have the same form and have a height of 12 mm and a thickness of 6 mm. In this case, the two inner magnets are spaced apart 2 mm from one another by the connecting element 6 at their respective sides facing one another.

In table 1, furthermore, in column #2, the force is calculated if, instead of the two inner magnets 3, 4, only one magnet 3 or 4 having the same geometry is mounted within the same outer magnetic ring 5. The associated force-distance characteristic curve is designated by 2010 in FIG. 24. This characteristic curve exhibits a behavior similar to that of the characteristic curve 2000, but it has a significantly more pronounced plateau around z=0. This means that, in this range of approximately plus-minus 5 mm around z=0, the force varies in the range of approximately 83 N and 78 N. This corresponds approximately to a force constancy of 5 N over a range of the armature displacement of approximately 12 mm. What is disadvantageous, however, is that the force at z=0 has a magnitude of only approximately half that in the case of two magnets.

TABLE 1

| Steps | Z Pos (mm) | #1 Fz (N) | #2 Fz (N) |
| --- | --- | --- | --- |
| 1 | −36 | −33.63 | −13.44 |
| 2 | −34 | −40.67 | −16.22 |
| 3 | −32 | −49.02 | −19.64 |
| 4 | −30 | −58.36 | −23.85 |
| 5 | −28 | −66.96 | −28.98 |
| 6 | −26 | −68.79 | −35.13 |
| 7 | −24 | −57.14 | −42.16 |
| 8 | −22 | −38.72 | −49.18 |
| 9 | −20 | −19.24 | −52.70 |
| 10 | −18 | −0.45 | −44.26 |
| 11 | −16 | 16.22 | −23.81 |
| 12 | −14 | 26.81 | 0.70 |
| 13 | −12 | 31.62 | 26.14 |
| 14 | −10 | 45.15 | 51.13 |
| 15 | −8 | 66.69 | 72.35 |
| 16 | −6 | 92.34 | 81.91 |
| 17 | −4 | 120.36 | 81.04 |
| 18 | −2 | 147.19 | 78.49 |
| 19 | 0 | 160.74 | 77.60 |
| 20 | 2 | 147.15 | 79.05 |
| 21 | 4 | 120.25 | 82.15 |
| 22 | 6 | 92.13 | 83.41 |
| 23 | 8 | 66.34 | 73.79 |
| 24 | 10 | 44.71 | 52.04 |
| 25 | 12 | 31.34 | 26.33 |
| 26 | 14 | 26.95 | 0.07 |
| 27 | 16 | 16.32 | −25.31 |
| 28 | 18 | −0.76 | −46.52 |
| 29 | 20 | −20.15 | −55.09 |
| 30 | 22 | −40.37 | −51.13 |
| 31 | 24 | −59.57 | −43.61 |
| 32 | 26 | −71.68 | −36.17 |

TABLE 1-continued

| Steps | Z Pos (mm) | #1 Fz (N) | #2 Fz (N) |
|---|---|---|---|
| 33 | 28 | −69.54 | −29.72 |
| 34 | 30 | −60.34 | −24.37 |
| 35 | 32 | −50.47 | −20.01 |
| 36 | 34 | −41.71 | −16.48 |
| 37 | 36 | −34.36 | −13.62 |

Since, in EUV lithography, the EUV mirrors of the EUV projection objective are becoming ever higher in mass on account of increasing diameters, and the armature distances are less than 3 mm, a solution including two inner magnets 3 and 4 is nevertheless appropriate since the bearing force of the gravitation compensator can thereby be significantly increased without an appreciable increase in structural space. In order that a plateau can be formed in the force-distance characteristic curve even when such a compensator element 1 is used, at least two of such compensators are mechanically connected to one another e.g. as illustrated in FIG. 1.

Figure 2A:
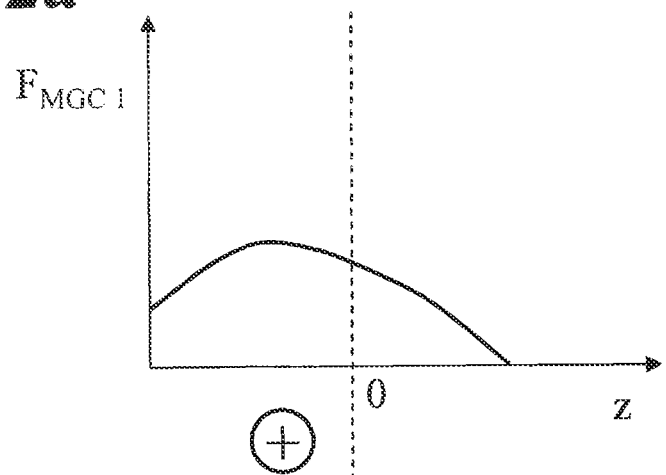
FIGS. 2a-c show force-distance characteristic curves of the magnetic compensator elements from FIG. 1 (a and b) and also the corresponding force-distance characteristic curve of the entire gravitation compensator from FIG. 1.

For such a compensator element, a force-distance characteristic curve arises such as is shown schematically in the diagram in FIG. 2*a*), or as was specifically calculated for an exemplary embodiment 2000 in FIG. 24. In this case, the distance is the relative displacement of the inner part of the magnetic compensator 1, also designated as armature, that is to say of the inner magnets 3 and 4, with the connecting element 6 relative to the outer magnet 5.

As is evident from the diagram in FIG. 2*a*), a maximum force arises in a zero position or slightly offset relative thereto, which maximum force can be used for the compensation of gravitation or gravitational force, while the force correspondingly decreases in the case of a displacement positively in the direction of the z-axis or oppositely.

Particularly in the case of the compensation of the gravitational force for heavy components such as, for example, heavy mirrors in the case of EUV (extreme ultraviolet) projection exposure apparatuses, which operate with light having a wavelength in the extreme ultraviolet wavelength range, in the case of the correspondingly high forces to be compensated for, a great change in the compensatable force occurs in the event of a displacement of the inner and outer components of the magnetic compensator element 1. This is undesirable, however, since, in the case of corresponding orientations of the mirror for which corresponding displacements along the z-axis can occur, the corresponding actuators have to move excessively large loads and, as a result, a higher energy input with corresponding evolution of heat is introduced into the apparatus, which is disadvantageous for projection exposure apparatuses for the precision desired therein. It is furthermore disadvantageous that a change in the force can result in a deformation of the mirror. The customary dimensional accuracies in the case of an EUV mirror are in the range of 0.1 nm or $10^{-10}$ m over a region of up to 30 cm. Even tiny changes in force can deform the mirror such that the dimensional accuracy is no longer ensured. For this reason, the weight force compensators should have a force that is as constant as possible also in the case of a change in the position of the mirror along the z-axis (in the direction of the gravitational force).

Accordingly, the embodiment in FIG. 1 provides a second magnetic compensator element 2, which is connected in series with the first magnetic compensator element 1 by a preferably non-magnetic connecting element 11, which is embodied e.g. in rigid fashion. In this case, series connection should be understood to mean connection, e.g. mechanical connection, of the movable parts of the magnetic compensators (also designated as hereinafter as armatures), such that the latter substantially perform a common movement. The connection of the compensation elements 1 and 2 via a non-magnetic connecting element 11 affords the advantage that the compensation elements 1, 2 remain virtually uninfluenced by the presence of a further compensation element 1, 2 with regard to their respective force-distance characteristic curve. The resulting force-distance characteristic curve of such a gravitation compensator can thus be calculated to a good approximation by the addition of the individual characteristic curves.

In terms of the construction, however, the second magnetic compensator element 2 is e.g. not necessarily identical to the first magnetic compensator element 1 and thus likewise has a first inner magnet 7, a second inner magnet 8, an outer magnetic ring 9 and also a connecting element 10 between first inner magnet 7 and second inner magnet 8. However, the second magnetic compensator element 2 is optionally, but not necessarily, embodied such that the force-distance characteristic curve is different than the force-distance characteristic curve of the first magnetic compensator element 1.

Figure 2B:
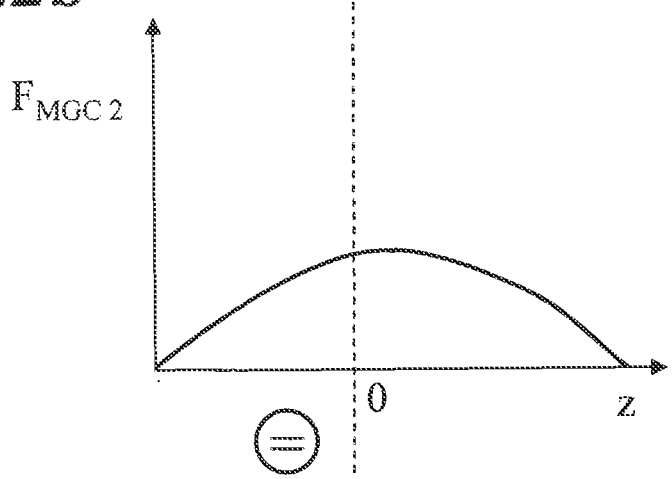

The force-distance characteristic curve of the second magnetic compensator element 2 is shown in FIG. 2*b*); it has with regard to its maximum, for example, a displacement in the z-direction relative to the maximum of the force-distance characteristic curve of the first compensator element 1 (FIG. 2*a*)).

Figure 2C:
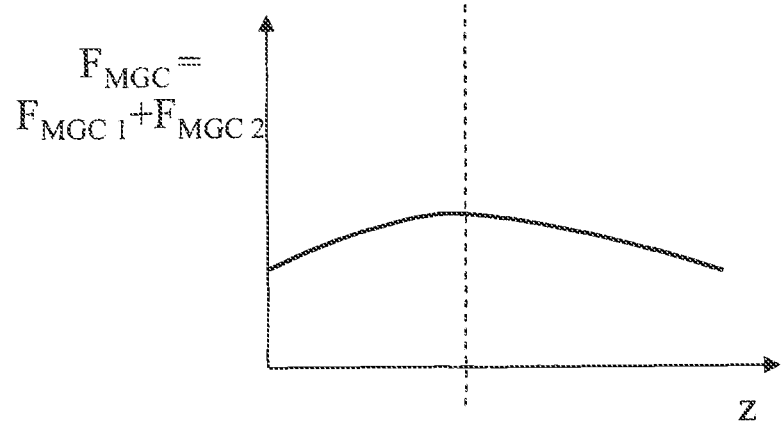

The combination of two magnetic compensator elements 1 and 2 having different force-distance characteristic curves makes it possible to provide a gravitation compensator having a force-distance characteristic curve that results from the superposition of the force-distance characteristic curves of the magnetic compensator elements 1 and 2. This is shown in the diagram in FIG. 2*c*). The result is that there are higher loads with smaller changes in the compensatable load in the case of position displacements of the mounted element, such as, for example, of a corresponding mirror. As a result, in the case of correspondingly equipped projection exposure apparatuses, in particular the corresponding illumination systems or projection objectives, the change in the position of the corresponding optical elements can be performed without great expenditure of force and therefore without high energy input with high precision and positioning accuracy. Overall, FIG. 2*c* shows that the force-distance characteristic curve of the combined compensator elements 1, 2 has a shape curved to a lesser extent around its maximum than the respective force-distance characteristic curves of the individual compensator elements. Thus, the force-distance characteristic curve of the combined compensator elements comes very close to the ideal force-distance characteristic curve with gradient zero. The ideal force-distance characteristic curve with gradient zero would advantageously have the consequence that the optical element, e.g. the EUV mirror, experiences, independently of its position in the z-direction, a constant force acting in this direction. This force can be taken into account in the design of the mirror shape to 0.1 nm (or even better), such that the EUV mirror has the desired shape in its operating position. Deviations of the mirror shape as a result of changes in the position of the mirror in the z-direction are thus precluded.

Alternatively, the above-described ideal force-distance characteristic curve of the compensation element can also be approximated by the magnets 3, 4, 5 being altered geometrically such that e.g. the outer magnet 5 occupies a larger volume region, as is the case e.g. with a larger diameter. The magnetic field generated by this magnet thus becomes more homogeneous and the force-distance characteristic curve is thus curved to a lesser extent around its maximum. Further alternatives for coming as close as possible to the ideal force-distance characteristic curve consist in the geometrical configuration of armature and stator (e.g. magnetic ring 5), e.g. by the profile and the density of the magnetic field lines being influenced with the ends, generally with the surfaces, of the magnets such that a virtually displacement-independent force results in the event of a relative displacement between armature and stator. The alternatives mentioned have the disadvantages, however, that the compensation elements are more difficult to produce, as a result of which such elements are significantly more expensive, or else, on account of the larger geometry, they cannot be used in the limited structural space of an EUV projection exposure apparatus or can be used only with increased outlay in respect of space, which likewise results in higher costs.

In the embodiment shown in FIG. 1, a device 12 for influencing the magnetic field or for guiding the magnetic flux is provided in the region of the connecting element between the first magnetic compensator element 1 and the second magnetic compensator element 2. The device includes ferromagnetic material in the form of plates 12 that prevent the occurrence of a magnetic short circuit between the inner magnets 4 and 7 of the two magnetic compensator elements 1 and 2, or the influencing of the magnetic fields of the individual compensator elements 1, 2 by the respective other element. Alongside the schematically illustrated plates 12 it is also possible, of course, to employ elements in other forms which are correspondingly suitable. Therefore, the resulting force-distance characteristic curve of such a gravitation compensator can be calculated to an even better approximation by the addition of the individual characteristic curves.

Figure 25:
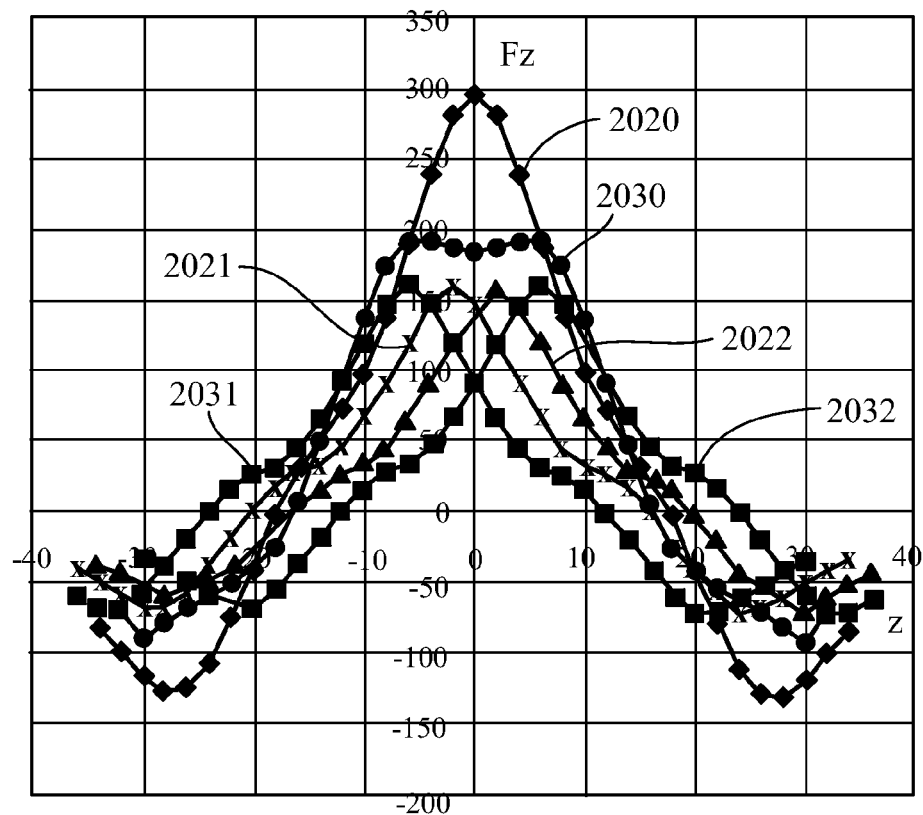
FIG. 25 shows calculated force-distance characteristic curves of two mechanically coupled magnetic compensator elements.
Figure 26:
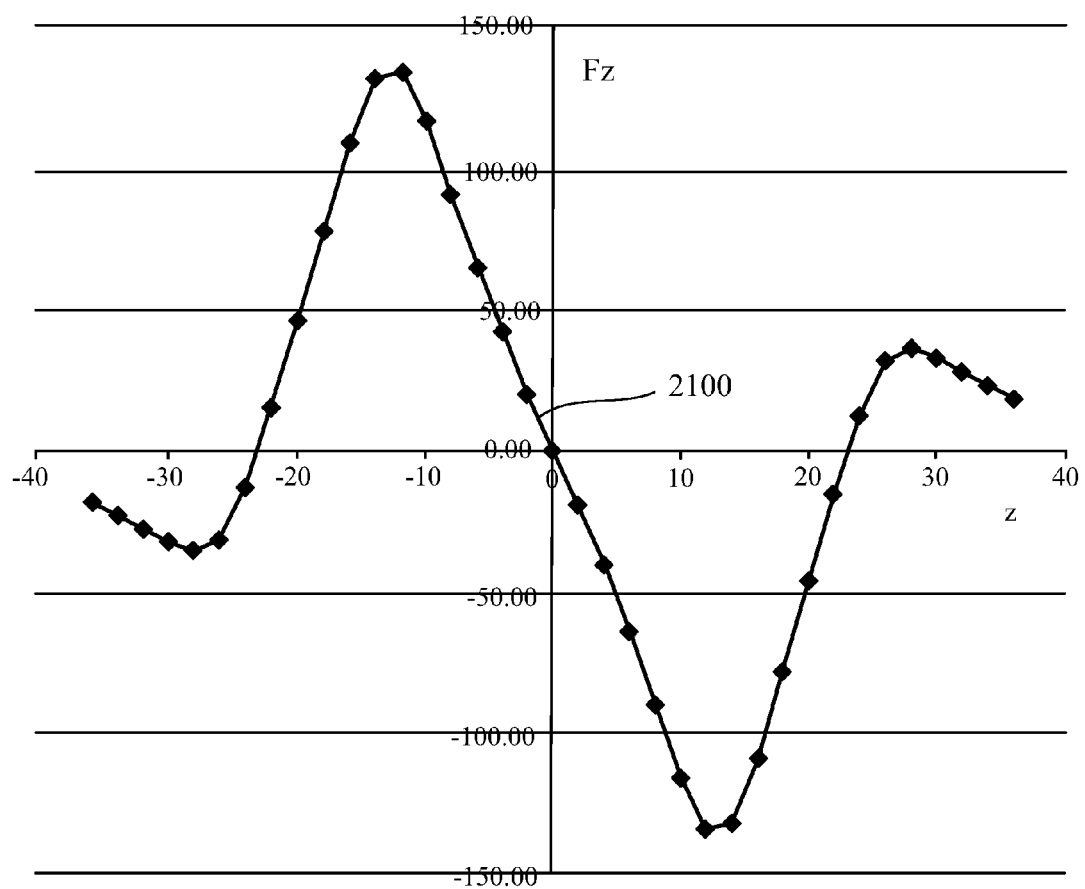
FIG. 26 shows calculated force-distance characteristic curves of a magnetic compensator element having two inner magnets of opposite polarity.

In order to quantitatively illustrate what has been discussed qualitatively above with reference to FIGS. 2a to 2c, reference should be made to FIG. 25 and table 2. Analogously to table 1, the computation steps are designed by Steps, in which the forces Fz for the corresponding z-position was calculated in 2 mm steps. In this case, the calculation was carried out for the magnet geometries specified above, wherein a magnetic compensator element 1, 2, in a corresponding manner to that illustrated in FIG. 1 and FIG. 22, includes two inner magnets having the same pole direction. Both compensator elements 1, 2 are dimensioned identically. The column #1 indicates the force for the compensator element having two inner magnets, as already represented above in table 1. Using the connecting element 11, the two magnetic compensator elements 1, 2 can then be connected to one another such that the inner magnets 3, 4 and 7, 8 of the respective compensator elements 1, 2 are in each case arranged symmetrically with respect to the respective outer magnet 5, 9. The deflection of the armature consisting of the inner magnets 3, 4, 7, 8 and the connecting elements 6, 11, 10 is measured with respect to a plane running parallel to the xy plane in the z-direction, wherein the plane at z=0 bisects the length of the connecting element 11 between the two compensator elements. In this case, only the values of the column #1 are to be doubled in order to obtain the resulting force-distance characteristic curve. This results, at z=0, in a force Fz of approximately 321 N. In the case of such an embodiment, the maximum force Fz arises, although with the disadvantage that around the region z=0, the force-distance characteristic curve is not particularly flat.

In order to eliminate this disadvantage here the connecting element 11 is dimensioned such that in its zero position at z=0 (wherein in the position z=0 the connecting element is bisected in the direction of the inner magnets) it positions the inner magnets relative to the respective outer magnets asymmetrically in relation to the respective compensation element 1, 2. This can be achieved through corresponding arrangement of the outer magnets 5, 9. In one exemplary embodiment, the inner magnets are displaced e.g. by 6 mm relative to the symmetrical position within a compensator element 1, 2 such that the displacement takes place in the opposite direction in the two compensator elements. This can be effected, for example, by the connecting element 11 being lengthened or shortened by 12 mm in comparison with the symmetrical design. This results, for each compensation element 1, 2, in a characteristic curve displaced by 6 mm in the z-direction, the characteristic curve having the corresponding force values with respect to the position z in columns F(z+6) and F(z−6) in table 2. The resulting characteristic curve then again arises by addition, the values of which are represented in the column sum 6 in table 2. In FIG. 25, the resulting force-distance characteristic curve is designated by 2030. The respective characteristic curves of the individual compensator elements are designed by 2031 and 2032.

In a further example, the connecting element 11 was dimensioned such that the inner magnets 3, 4, 7, 8 are only displaced by 2 mm relative to their symmetrical arrangement with respect to the respective outer magnet 5, 9. This can be achieved by correspondingly shortening or lengthening the connecting element 11 by 4 mm. The respective characteristic curves of the compensator elements 1, 2 are presented in columns F(z+2) and F(z−2) in table 2, and are likewise represented by the curves 2021 and 2022 in FIG. 25. The resulting characteristic curve is obtained from the column sum 2; it is designated by 2020 in FIG. 25.

FIG. 25 reveals that a plateau can be formed in the event of a displacement of the inner magnets by the connecting element 11. It is thus evident that only a force variation of around approximately 8 N takes place in the case of a displacement in each case of 6 mm over an interval of [−6 mm; +6 mm].

TABLE 2

| Steps | Z Pos | #1 Fz(N) | F(z + 6) Fz(N) | F(z − 6) Fz(N) | sum 6 Fz(N) | F(z + 2) Fz(N) | F(z − 2) Fz(N) | sum 2 |
|---|---|---|---|---|---|---|---|---|
| 1 | −36 | −33.63 | −58.36 | | −58.36 | −40.67 | | −40.67 |
| 2 | −34 | −40.67 | −66.96 | | −66.96 | −49.02 | −33.63 | −82.65 |
| 3 | −32 | −49.02 | −68.79 | | −68.79 | −58.36 | −40.67 | −99.03 |
| 4 | −30 | −58.36 | −57.14 | −33.63 | −90.77 | −66.96 | −49.02 | −115.98 |
| 5 | −28 | −66.96 | −38.72 | −40.67 | −79.40 | −68.79 | −58.36 | −127.15 |
| 6 | −26 | −68.79 | −19.24 | −49.02 | −68.26 | −57.14 | −66.96 | −124.10 |
| 7 | −24 | −57.14 | −0.45 | −58.36 | −58.81 | −38.72 | −68.79 | −107.52 |
| 8 | −22 | −38.72 | 16.22 | −66.96 | −50.74 | −19.24 | −57.14 | −76.38 |
| 9 | −20 | −19.24 | 26.81 | −68.79 | −41.99 | −0.45 | −38.72 | −39.18 |
| 10 | −18 | −0.45 | 31.62 | −57.14 | −25.52 | 16.22 | −19.24 | −3.02 |
| 11 | −16 | 16.22 | 45.15 | −38.72 | 6.43 | 26.81 | −0.45 | 26.35 |
| 12 | −14 | 26.81 | 66.69 | −19.24 | 47.46 | 31.62 | 16.22 | 47.84 |

TABLE 2-continued

| Steps | Z Pos | #1 Fz(N) | F(z + 6) Fz(N) | F(z − 6) Fz(N) | sum 6 Fz(N) | F(z + 2) Fz(N) | F(z − 2) Fz(N) | sum 2 |
|---|---|---|---|---|---|---|---|---|
| 13 | −12 | 31.62 | 92.34 | −0.45 | 91.88 | 45.15 | 26.81 | 71.96 |
| 14 | −10 | 45.15 | 120.36 | 16.22 | 136.57 | 66.69 | 31.62 | 98.31 |
| 15 | −8 | 66.69 | 147.19 | 26.81 | 173.99 | 92.34 | 45.15 | 137.49 |
| 16 | −6 | 92.34 | 160.74 | 31.62 | 192.36 | 120.36 | 66.69 | 187.05 |
| 17 | −4 | 120.36 | 147.15 | 45.15 | 192.31 | 147.19 | 92.34 | 239.52 |
| 18 | −2 | 147.19 | 120.25 | 66.69 | 186.95 | 160.74 | 120.36 | 281.10 |
| 19 | 0 | 160.74 | 92.13 | 92.34 | 184.46 | 147.15 | 147.19 | 294.34 |
| 20 | 2 | 147.15 | 66.34 | 120.36 | 186.70 | 120.25 | 160.74 | 281.00 |
| 21 | 4 | 120.25 | 44.71 | 147.19 | 191.90 | 92.13 | 147.15 | 239.28 |
| 22 | 6 | 92.13 | 31.34 | 160.74 | 192.09 | 66.34 | 120.25 | 186.60 |
| 23 | 8 | 66.34 | 26.95 | 147.15 | 174.11 | 44.71 | 92.13 | 136.84 |
| 24 | 10 | 44.71 | 16.32 | 120.25 | 136.58 | 31.34 | 66.34 | 97.69 |
| 25 | 12 | 31.34 | −0.76 | 92.13 | 91.37 | 26.95 | 44.71 | 71.66 |
| 26 | 14 | 26.95 | −20.15 | 66.34 | 46.20 | 16.32 | 31.34 | 47.67 |
| 27 | 16 | 16.32 | −40.37 | 44.71 | 4.34 | −0.76 | 26.95 | 26.19 |
| 28 | 18 | −0.76 | −59.57 | 31.34 | −28.23 | −20.15 | 16.32 | −3.82 |
| 29 | 20 | −20.15 | −71.68 | 26.95 | −44.73 | −40.37 | −0.76 | −41.13 |
| 30 | 22 | −40.37 | −69.54 | 16.32 | −53.22 | −59.57 | −20.15 | −79.72 |
| 31 | 24 | −59.57 | −60.34 | −0.76 | −61.10 | −71.68 | −40.37 | −112.05 |
| 32 | 26 | −71.68 | −50.47 | −20.15 | −70.62 | −69.54 | −59.57 | −129.11 |
| 33 | 28 | −69.54 | −41.71 | −40.37 | −82.08 | −60.34 | −71.68 | −132.02 |
| 34 | 30 | −60.34 | −34.36 | −59.57 | −93.93 | −50.47 | −69.54 | −120.01 |
| 35 | 32 | −50.47 | | −71.68 | −71.68 | −41.71 | −60.34 | −102.05 |
| 36 | 34 | −41.71 | | −69.54 | −69.54 | −34.36 | −50.47 | −84.83 |
| 37 | 36 | −34.36 | | −60.34 | −60.34 | | −41.71 | −41.71 |

Figure 3:
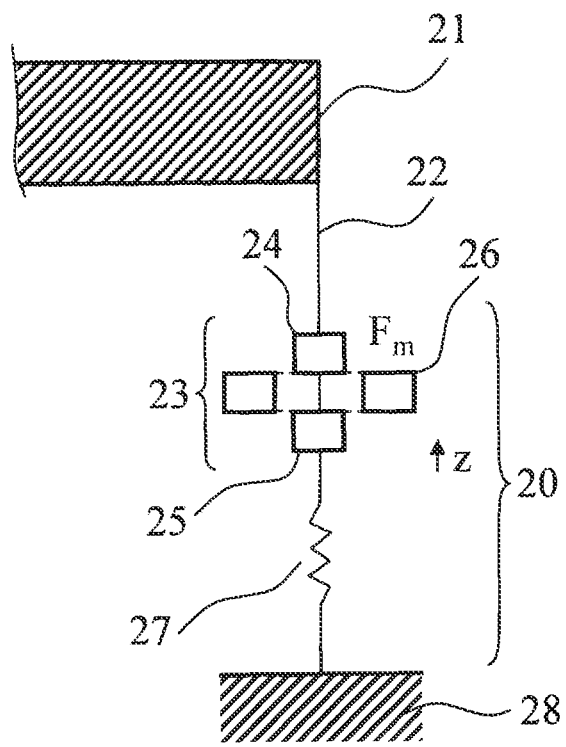
FIG. 3 shows a second embodiment of a gravitation compensator according to the disclosure.

A further embodiment of a gravitation compensator 20 according to the disclosure is illustrated schematically again in FIG. 3. The gravitation compensator 20 likewise includes two compensator elements 23 and 27, wherein this time the combination of a magnetic compensator element 23 and a mechanical compensator element 27 in the form of a mechanical spring or a comparably elastic element is involved. In the case of the exemplary embodiment shown in FIG. 3, the two compensator elements are connected sequentially in series, such that the optical element 21 to be mounted is mounted via corresponding connecting elements 22 directly on the magnetic compensator element 23 and indirectly via the latter also on the mechanical compensator element 27. The gravitation compensator 20 is again mounted on a corresponding housing 28 or the like.

Figure 4:
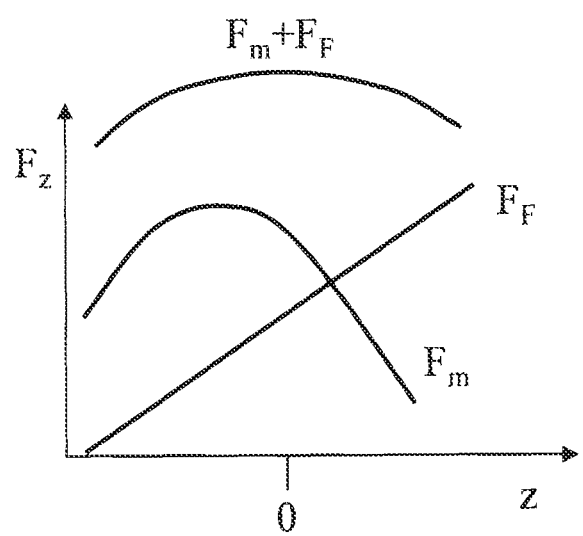
FIG. 4 shows a diagram showing the force-distance characteristic curves of the compensator elements and also of the entire gravitation compensator from FIG. 3.

The magnetic compensator element 23 again includes two inner magnets 24 and 25 and also an outer magnetic ring 26, which is correspondingly shown in a sectional illustration again. The optical element 21 is movable in the z-direction, such that a corresponding force-distance characteristic curve as illustrated in FIG. 4 can be manifested for the compensator elements 23 and 27 and also for the gravitation compensator 20. In this case, the inner magnets can be arranged with the same or opposite polarity correspondingly with force-distance characteristic curves according to FIG. 24.

In this case, the magnetic compensator element 23 provides the compensation force $F_m$ for compensating for the weight force of the optical element 21, while the mechanical compensator element 27 provides the force component $F_F$ therefor.

The force-distance characteristic curve of the mechanical compensator element 27 follows Hooke's law, thus resulting in a linear relationship between compensation force in the z-direction $F_z$ and the distance z.

The magnetic compensator element 23 makes available, in a manner similar to that in the illustration in FIG. 2, a force-distance characteristic curve having a maximum in the vicinity of the zero position. Superposition of the force-distance characteristic curves of the two combined compensator elements results in the characteristic curve of the gravitation compensator 20, which is identified by $F_m + F_F$. It can be discerned that a higher load can be compensated for, while at the same time smaller relative force differences can be observed over the adjusting distance z of the optical element 21.

Figure 5:
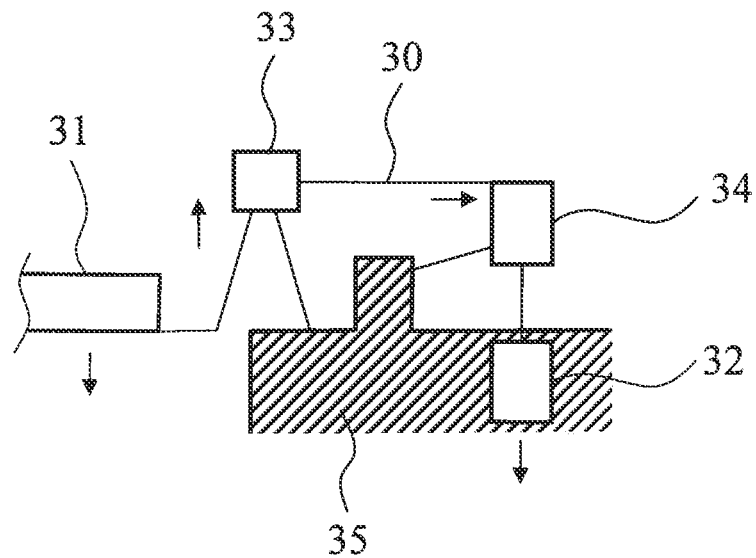
FIG. 5 shows an illustration of a third embodiment of a gravitation compensator according to the disclosure.
Figure 6:
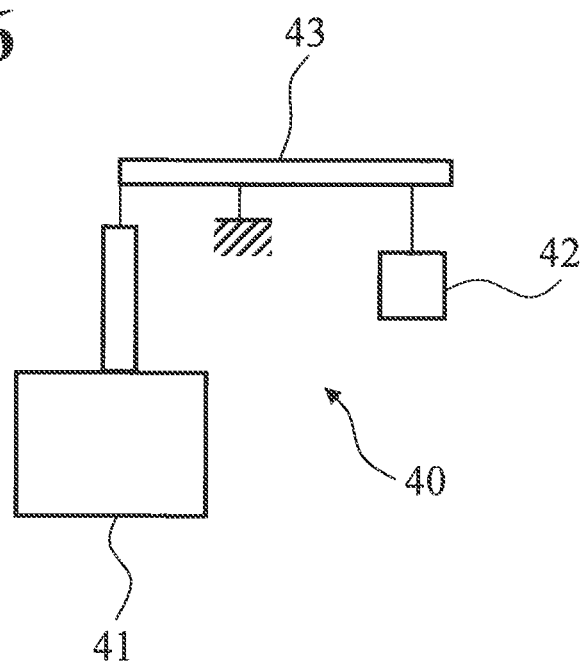
FIG. 6 shows a fourth embodiment of a gravitation compensator according to the disclosure.
Figure 7:
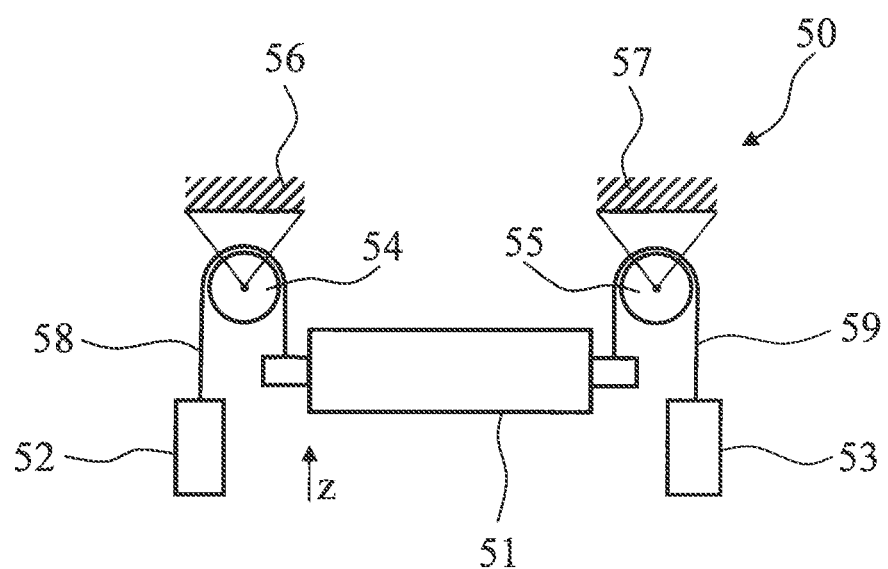
FIG. 7 shows a fifth embodiment of a gravitation compensator according to the disclosure.

FIGS. 5, 6 and 7 and also 8 present further embodiments of gravitation compensators, which, however, are based on mechanical principles.

The gravitation compensator 30 shown schematically in FIG. 5 makes use of two solid articulations 33 and 34, which are connected to the optical element 31, on the one hand, and a counterweight 32, on the other hand, via corresponding connecting elements (not designated more specifically). The solid articulations 33 and 34 can in turn be mounted on a housing 35 or the like. As a result of the diversion of the weight force caused by the optical element 31 via the solid articulations 33 and 34 into an upwardly directed force, a corresponding compensation can be obtained via the counterweight 32.

A similar principle is shown in the embodiment of the gravitation compensator 40 in FIG. 6, in which the principle of a beam balance is used. The optical element 41 to be mounted, for example a mirror of an EUV projection exposure apparatus, is arranged on one lever arm of the balance device 43, while the counterweight 42 is provided on the other lever arm. It is only if the displacement of the optical element 41 exceeds a specific limit value that a correspondingly strong change in the weight force to be compensated for will occur as a result of the change in the leverage ratios. Within a certain movement range around the equilibrium state, however, only a small change in the compensation force can be observed.

FIG. 7 shows an embodiment of a gravitation compensator 50 that likewise uses two counterweights 52 and 53 for compensating for the weight force of the optical element 51. The counterweights 52 and 53 are connected to the optical element via cable pulls 59 and 58 led via deflection rollers 54 and 55, wherein a movement of the optical element 51 along the z-axis is again possible here, without a change in the compensatable force occurring. The corresponding deflection rollers 55 and 54 are again arranged for example on the housing 56, 57 of a corresponding optical arrangement of a projection exposure apparatus, such as, for example, in an illumination system or a projection objective.

Figure 8:
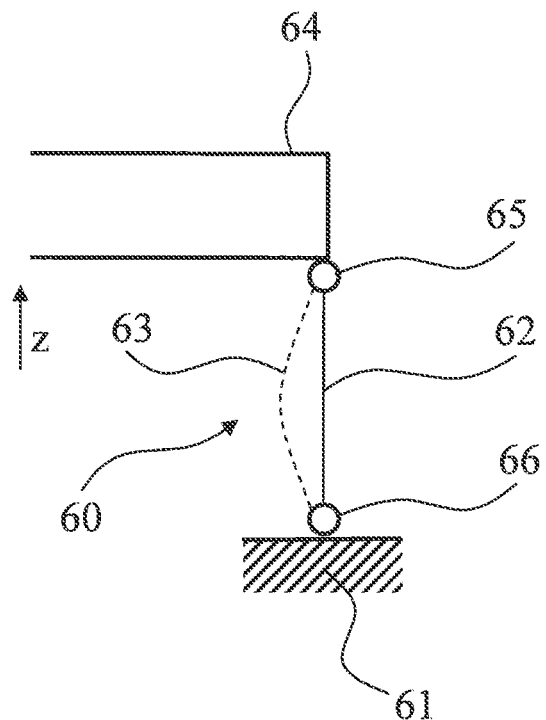
FIG. 8 shows a sixth embodiment of a gravitation compensator according to the disclosure.
Figure 9:
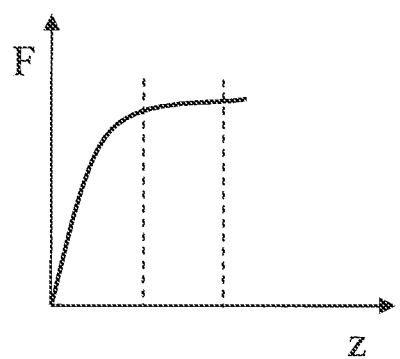
FIG. 9 shows a diagram showing the force-distance characteristic curve of the gravitation compensator from FIG. 8.

FIG. 8 shows a gravitation compensator 60, which uses a mechanical spring element 62, the force-distance characteristic curve of which, shown in FIG. 9, has a range in which a constant force profile or virtually constant force profile can be observed over the extension range of the mechanical spring element 62. This can be observed for example for buckling bars in specific ranges, such that, in the case of a correspondingly suitably chosen operating range, the buckling bar 62 has the desired force-distance profile in the flexed state (see 63), such that, in the case of a displacement of the optical element 64 along the z-axis, the corresponding change in the flexure of the buckling bar 62, 63 is not accompanied by a significant change in the compensatable force.

Figure 10:
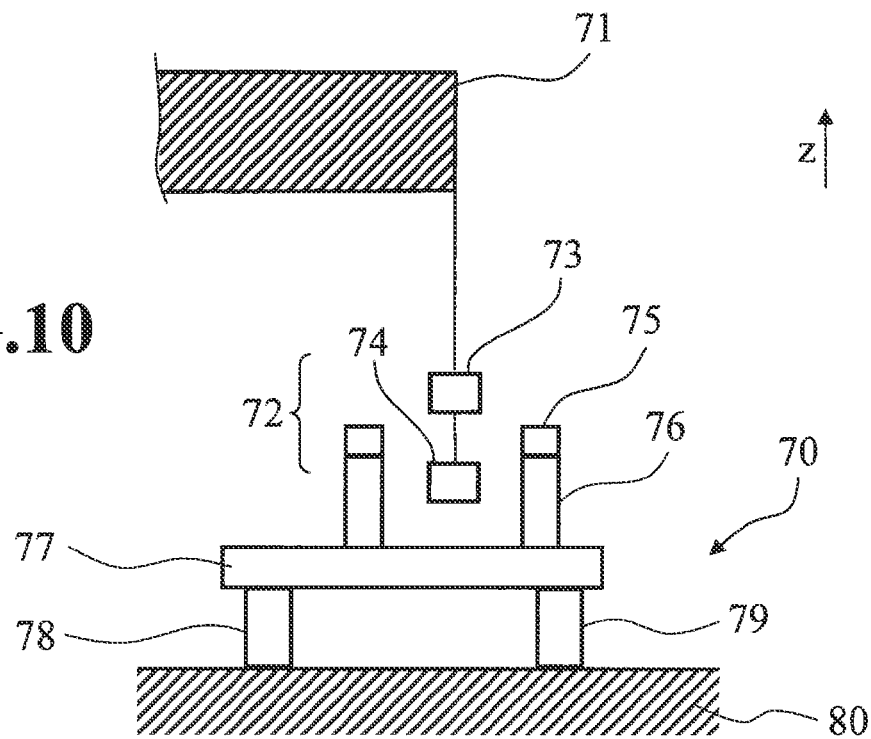
FIG. 10 shows a seventh embodiment of a gravitation compensator according to the disclosure.

FIG. 10 shows a further embodiment of a gravitation compensator 70, which realizes the displacement possibility of the optical element 71, that is to say the corresponding positioning of the optical element 71 along the z-axis with constant compensation force, by virtue of the fact that provision is made of a compensator element such as a magnetic compensator element 72, for example, in combination with actuators 78, 79 for displacing the optical element in the z-direction. In this case, the magnetic compensator element is connected via bearing element 76, 77 to the actuators 78, 79, which are in turn mounted on a housing 80 or the like. The actuators 78 and 79 provide the movement of the optical element 71 in the z-direction, such that the magnetic compensator element 72 per se itself has to accommodate no or only slight distance changes. Accordingly, the inner magnets 73 and 74 can be held virtually fixed relative to the outer magnetic ring 75, such that no change in the compensatable force therefore occurs.

Figure 11:
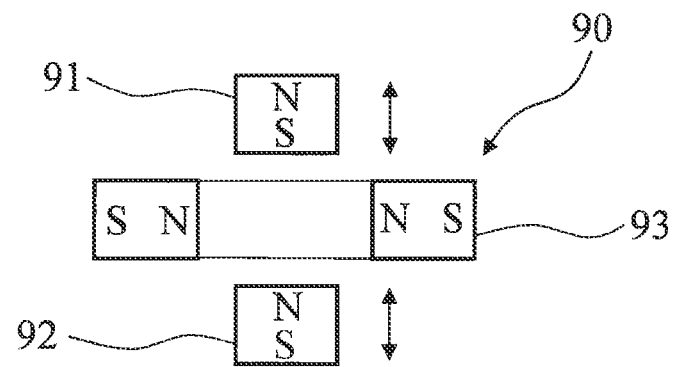
FIG. 11 shows an eighth embodiment of a gravitation compensator according to the disclosure.

FIG. 11 shows, in a schematic illustration, a magnetic gravitation compensator 90 including inner magnets 91 and 92 and also the outer magnetic ring 93. In order to compensate for aging effects, the inner magnets 91, 92 are embodied as adjustable, in particular adjustable with respect to one another or else with respect to the outer magnetic ring 93, such that a readjustment can be performed through the adjustment of the magnets. It is thus possible to eliminate changes with regard to the compensatable force on account of aging phenomena.

Figure 12:
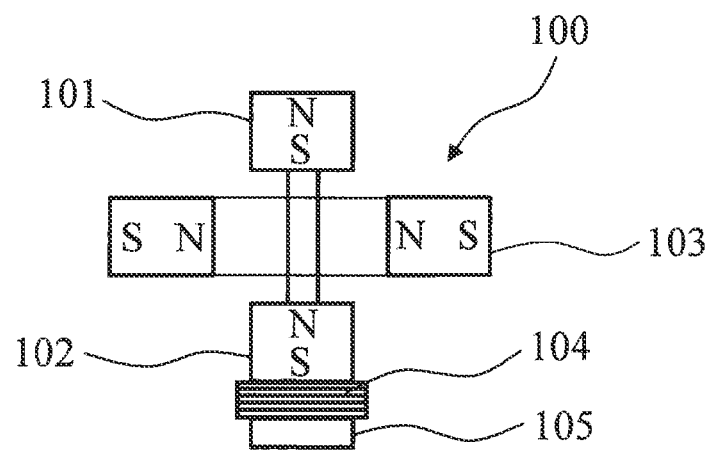
FIG. 12 shows a ninth embodiment of a gravitation compensator according to the disclosure.

The embodiment of the gravitation compensator 100 shown in FIG. 12 has an adjustability of the magnetic gravitation compensation in the form such that a yoke 105 with a coil 104 is assigned to the inner magnets 102, such that the strength of the magnetic field experienced in the magnetic field strength or the magnetic flux density of the inner magnet 102 is variable, such that the entire magnetic gravitation compensator 100 is adjustable with regard to the compensatable weight force by a change in the current flow through the coil 104. It goes without saying that it is also possible that, instead of the inner magnet 102, the inner magnet 101 and/or the outer magnet 103 or all these magnets or different combinations thereof is/are made correspondingly manipulatable. With this arrangement, too, a readjustment is therefore possible, such that it is possible to compensate both for aging effects and for changes in the compensatable force as a result of positioning movements of the optical element to be mounted.

Figure 13:
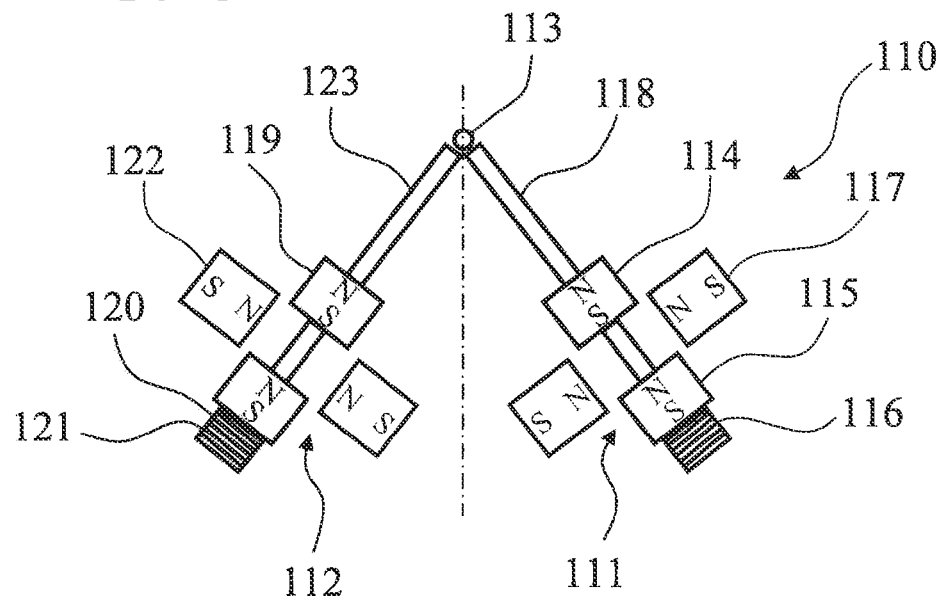
FIG. 13 shows a tenth embodiment of a gravitation compensator according to the disclosure.

FIG. 13 shows a gravitation compensator 110, which at the same time can also be used as a drive for an optical element 113 to be mounted.

The gravitation compensator 110 includes two magnetic compensator elements 111 and 112, each including inner magnets 114, 115 and 119, 120 and also outer magnetic rings 117 and 122. The magnetic compensator elements 111 and 112 are connected via correspondingly rigid connecting elements 118 and 123 to the optical element 113 to be mounted. In a manner similar to that in the case of the embodiment in FIG. 12, a yoke with a coil 116 and 121 is respectively assigned to the inner magnets 115 and 120, such that the strength of the magnetic field of the corresponding inner magnets 115 and 120 is variable. The parallel arrangement or configuration with compensator elements 111 and 112 arranged in angular fashion alongside one another enables both a corresponding manipulation of the optical element 113 and a corresponding gravitation compensation with compensation force set to be constant.

Figure 14:
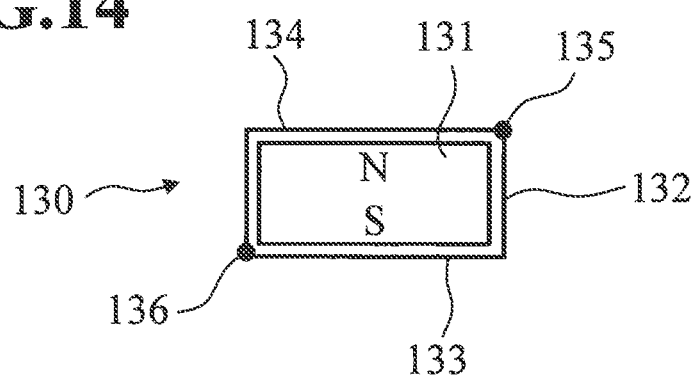
FIG. 14 shows a cross-sectional view of an encapsulated magnet.
Figure 15:
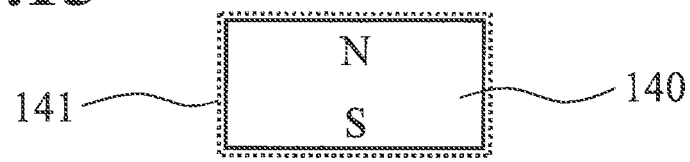
FIG. 15 shows a cross-sectional view of a coated magnet for use in a gravitation compensator according to the disclosure.

The illustrations in FIGS. 14 and 15 show individual magnets and corresponding measures for protecting the magnets against ambient influences. By way of example, in projection exposure apparatuses that operate with EUV light, it may be desirable to provide hydrogen-containing atmospheres or atmospheres including predominantly hydrogen, wherein a corresponding atmosphere including molecular hydrogen or hydrogen atoms can lead to an impairment of the magnets. This in turn has the effect that in corresponding atmospheres, over time, the compensatable weight force in the case of magnetic compensator elements is disadvantageously changed.

In one embodiment of a magnet 130, as illustrated in FIG. 14, the magnet 131 is encapsulated in a gas-tight manner in a housing composed of a thin metal sheet having a thickness of approximately 1 mm, such that a different atmosphere can be set within the encapsulation. The encapsulation 132 consists of two parts 133 and 134, which are joined together at the welding seams 135 and 136, thus resulting in a symmetrical construction, in particular.

Another possibility for separating the magnet from the surrounding atmosphere is shown with the exemplary embodiment in FIG. 15. The magnet 140 has a gas-tight coating 141, which prevents gases, such as hydrogen, for example, from being able to penetrate into the material of the magnet and cause damage there. The coating can have a thickness of up to 0.5 mm.

Figure 16:
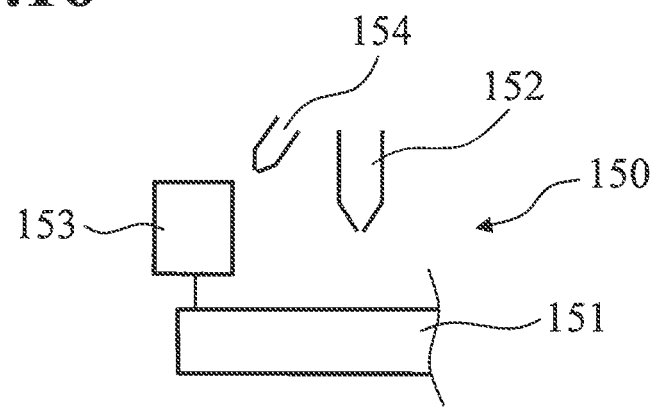
FIG. 16 shows an illustration of a gas purging device for use in a gravitation compensator according to the disclosure, or in a projection exposure apparatus according to the disclosure.

A further possibility for preventing the harmful influence of the surroundings, such as a hydrogen atmosphere, for example, on a gravitation compensator is shown in FIG. 16. In the case of the arrangement 150, a gas is blown onto the gravitation compensator 153, which holds the optical element 151, by use a nozzle 154, the gas being harmless to the gravitation compensator, while the gas atmosphere desired for the optical element 151, such as, for example, a hydrogen-containing atmosphere or atmosphere predominantly containing hydrogen, is provided via the nozzle 152. Accordingly, the arrangement 150 has a purge device 154 that can supply protective gas for the gravitation compensator 153.

Figure 17:
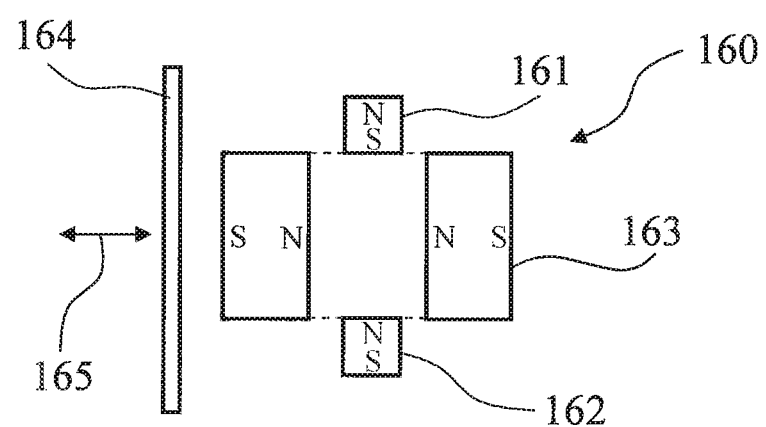
FIG. 17 shows an eleventh embodiment of a gravitation compensator according to the disclosure.

FIG. 17 shows a further embodiment 160 of a magnetic gravitation compensator, which again has inner magnets 161 and 162 and also an outer magnetic ring 163. In order to change the magnetic conditions in a targeted manner and thus to compensate for changes at the gravitation compensator 160 as a consequence of aging influences, ambient influences or changes in the compensation force as a result of positioning operations, an exchangeable ferromagnetic material 164 can be provided, which is used for the corresponding readjustment. The schematic illustration in FIG. 17 illustrates a plate-type form of the ferromagnetic material 164 laterally with respect to the outer magnetic ring 163, any other configuration also being conceivable with regard to the form of the magnetic material 164 and/or the fitting location. The doubleheaded arrow 165 symbolizes the exchangeability or the variability with which the adjustment can be performed.

Figure 18:
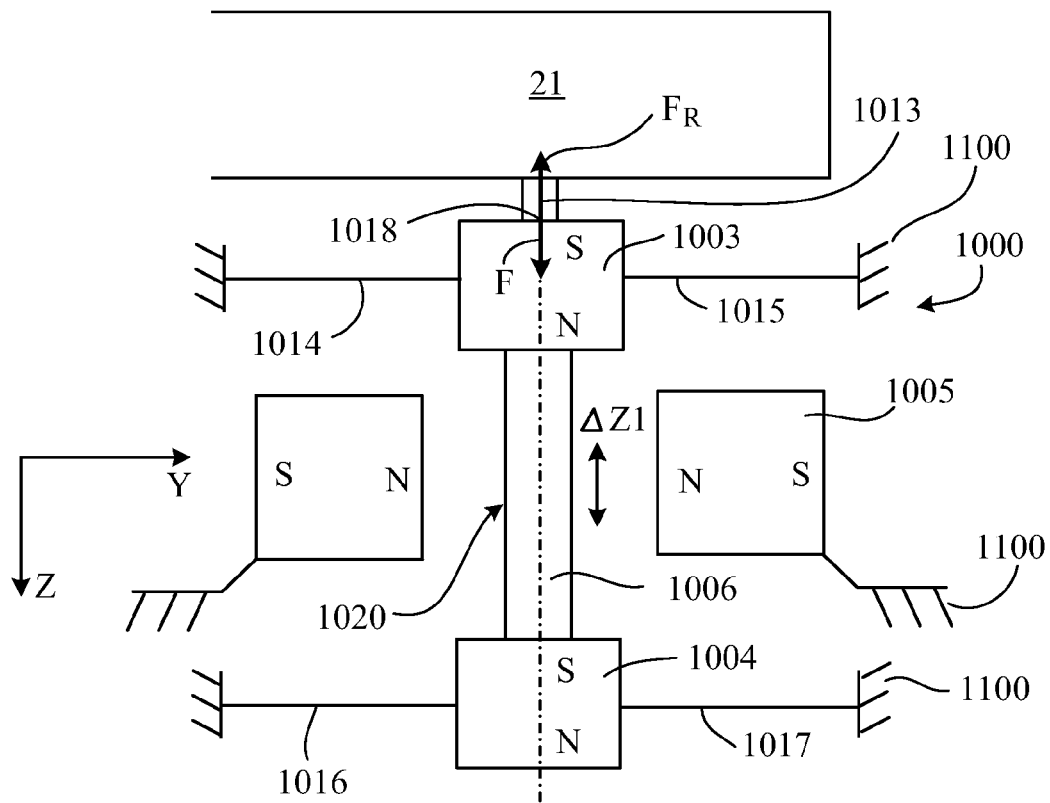
FIG. 18 shows a schematic view of a first embodiment of a further weight force compensator according to the disclosure.
Figure 19:
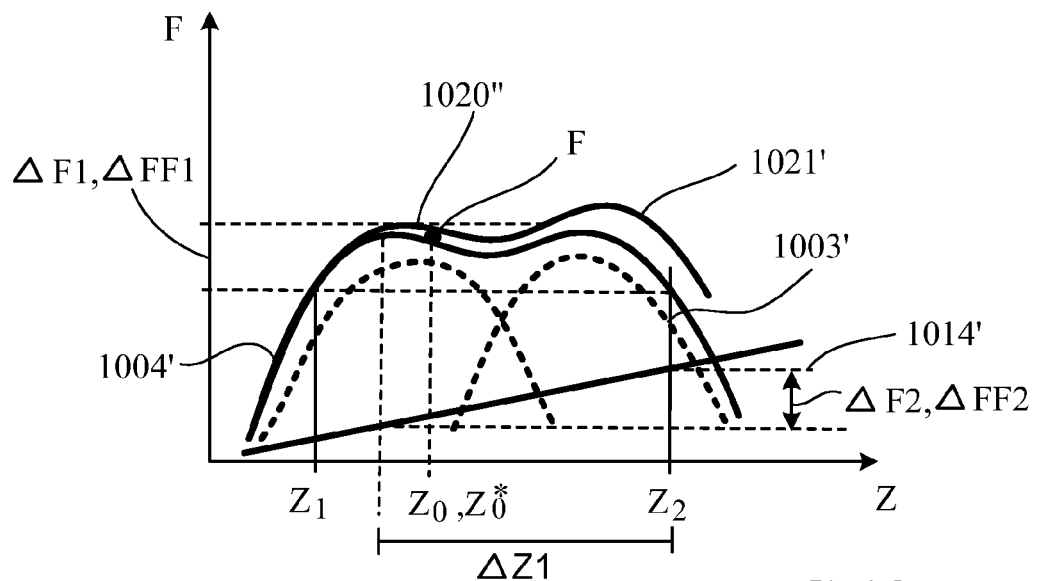
FIG. 19 shows a schematic force-distance characteristic curve family for the weight force compensator according to FIG. 18.

FIG. 18 shows an additional embodiment of the present disclosure in the form of a weight force compensator 1000 for mounting optical elements 21 and for compensating for a force F which acts in a direction z and is applied to a force application point 1018 in a microlithographic projection exposure apparatus (not illustrated). The gravitation compensator has an armature 1020, which, in the exemplary embodiment illustrated, analogously to the exemplary embodiment according to FIG. 1, includes two inner magnets 1003 and 1004, which are connected to a connecting element 1006, wherein the connecting element can be embodied analogously to the connecting element 6 illustrated in FIG. 1. In contrast to the exemplary embodiment according to FIG. 1, the polarities of the inner magnets 1003 and 1004 are reversed. The force F thus acts in the opposite direction. The armature 1020 can be moved in the direction z of the force F by a distance interval $\Delta z1$. Furthermore, the weight force compensator 1000 has an outer magnetic ring 1005, which can be embodied analogously to that in FIG. 1 and which is supported on a housing 1100, optionally fixedly but also in an actuable manner (not illustrated). The inner and outer magnets 1003, 1004 and 1005 can be permanent magnets, which form one possible embodiment of a compensation element. The armature 1020 of the compensation element illustrated, the armature being movable in the direction z of the force F and including the force application point 1018, has a first force-distance characteristic curve 1020' in the direction z of the force F. The characteristic curve is illustrated in FIG. 19 as one resulting from addition of two force-distance characteristic curves 1003' and 1004'. The two force-distance characteristic curves 1003' and 1004' show schematically in each case (apart from a displacement in the z-direction) the force-distance characteristic curve if the armature included only the inner magnet 1003 or 1004.

These characteristic curves are illustrated in a simplified fashion and can e.g. also have the form of the characteristic curve 2010 from FIG. 24. Since both inner magnets 1003 and 1004 are connected to one another rigidly at a connection distance by the connecting element, the positions of the force-distance characteristic curves 1003' and 1004' along the z-axis are concomitantly determined by the connection distance, thereby determining the width (and also height) of the resulting force-distance characteristic curve 1020'. As shown schematically in FIG. 19, the width and form of the plateau-like range between the z-coordinates z1 and z2 is determined by the use of two inner magnets of the armature 1020 that are spaced apart in the force direction z. Using additional magnets arranged on the armature, the force-distance characteristic curve can be shaped further. Likewise, by additional outer magnets, as was already explained e.g. in connection with FIG. 1 with the advantages described there, the force-distance characteristic curve can further be advantageously influenced, e.g. by virtue of the fact that the plateau-shaped range between z1 and z2 is widened and/or the fluctuations of the force in this range can be reduced.

The compensation element formed by the inner and outer magnets 1003, 1004 and 1005 has a first bearing stiffness 51. The latter is given by the quotient of the difference $\Delta FF1$ between a maximum and a minimum force of a first force interval $\Delta F1$ including the force F and the absolute value of a first distance interval $\Delta z1$—assigned to the first force interval $\Delta F1$ by way of the first force-distance characteristic curve—around a first point z0, to which the force F is assigned by way of the first force-distance characteristic curve (see FIG. 19).

The weight force compensator according to FIG. 18 furthermore includes guide mechanisms 1014, 1015, 1016, 1017 with a second force-distance characteristic curve 1014' (see FIG. 19) in the direction of the force F for guiding the armature 1020 of the compensation element. The guide mechanisms can be connected to a housing 1100 rigidly or in an actuable manner (not illustrated). Furthermore, the guide mechanisms have a second bearing stiffness S2, given by the quotient of the difference $\Delta FF2$ between a maximum and a minimum force of a second force interval $\Delta F2$—assigned by the second force-distance characteristic curve 1014' by the first distance interval $\Delta z1$ around the first point z0—and the absolute value of the first distance interval $\Delta z1$. In this case, the force F of the force compensator, the force being generated for the compensation of the counterforce Fr, results from the addition of the forces from the first and from the second force-distance characteristic curve 1020', 1014', wherein the force-distance characteristic curve 1021' resulting from the addition of forces has a third bearing stiffness S3. The latter results as the quotient of the difference $\Delta FF3$ between a maximum and a minimum force of at least one third force interval $\Delta F3$ including the force F and the absolute value of the first distance interval $\Delta z1$ around at least one point z0*, wherein the at least one third force interval $\Delta F3$ is defined by the resulting force-distance characteristic curve 1021' by the first distance interval $\Delta z1$ around the at least one point z0* and, in this case, the at least one point z0* is assigned to the force F by way of the resulting force-distance characteristic curve 1021'. In FIG. 19, the coordinates z0 and z0* are very close together since the first and the resulting force-distance characteristic curve 1020', 1021', in the range around z0, differ only slightly in terms of their force. Furthermore, in FIG. 19 the second force-distance characteristic curve is linear, that is to say that it corresponds to Hooke's law. This is then at least approximately the case if the guide mechanisms 1014 to 1017 are embodied in a leaf-spring-like manner. The movement of the armature 1020 in the y-direction is thus very restricted. If analogous leaf springs are likewise used as guide mechanisms in the x-direction, then a significant restriction of the armature movement is also effected in this direction. As a result, the armature is advantageously guided in the x-y direction, such that, in the case of a z-movement of the armature, e.g. as a result of impact or adjustment on the mirror 21, the xy position of the force application point 1018 and thus the xy position of the mirror 21 are substantially maintained. This simplifies the positioning of the mirror in terms of control engineering. In the case of the additional weight force compensator 1000 according to FIG. 18 it advantageously emerges that the bearing stiffness S3 is less than or equal to the bearing stiffness S1, that is to say the bearing stiffness without guide mechanisms, and/or that the resulting force-distance characteristic curve 1021' has at least two points z0* which are spaced apart from one another by more than the first distance interval $\Delta z1$. It is thus advantageously possible to increase the distance interval, such that the armature can be moved over a larger distance range, given skilful dimensioning of the stiffness of the guide mechanisms even with low bearing stiffness S3. This is illustrated in FIG. 20.

Figure 20:
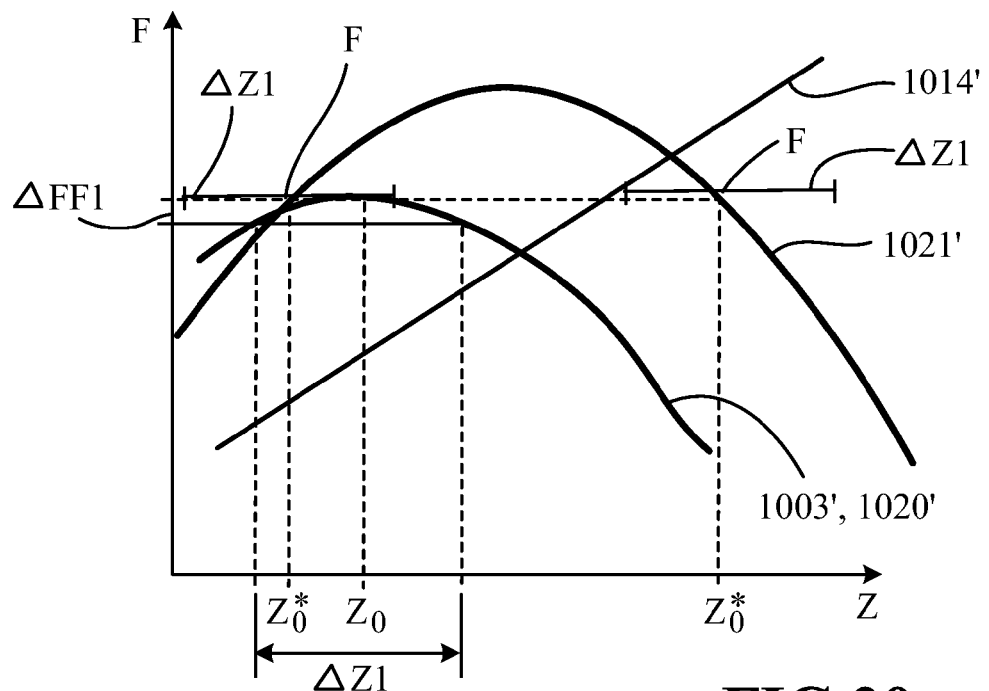
FIG. 20 shows a schematic force-distance characteristic curve family for a weight force compensator slightly modified relative to FIG. 18.

FIG. 20 relates to an embodiment of a weight force compensator according to FIG. 18 in which the inner magnet 1004, the guide mechanisms 1016, 1017 and also the connecting element 1006 were removed. This results in a first force-distance characteristic curve 1003' given by the inner magnet 1003, which is simultaneously also the characteristic curve 1020' of the armature if no guide mechanisms 1014 and 1015 were present. However, as in FIG. 19, the guide mechanisms have a linear second force-distance characteristic curve 1014' according to Hooke's law, as a result of which the resulting force-distance characteristic curve 1021' arises as a result of addition. This characteristic curve then has two points z0* which are assigned to the force F and which are spaced apart from one another by more than the distance interval Δz1. This results in a used range of the weight force compensator around two points z0*. In this exemplary embodiment, however, this is associated with a higher bearing stiffness around the respective points z0* if the respective used range is intended to permit a displacement of the armature 1020 by the first distance interval.

Figure 21:
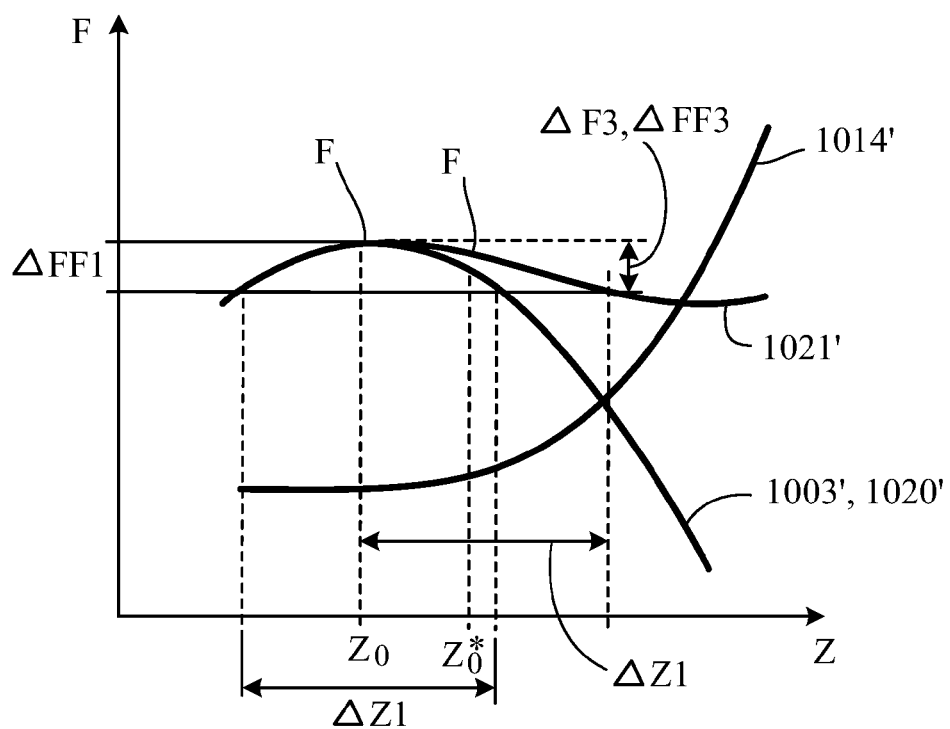
FIG. 21 shows a schematic force-distance characteristic curve family for a further weight force compensator slightly modified relative to FIG. 18.

The force-distance characteristic curves in FIG. 21 relate to above embodiment according to FIG. 20, but with the difference that the second force-distance characteristic curve 1014' of the guide mechanisms 1014, 1015 has a non-linear profile. The resulting force-distance characteristic curve has a plateau-shaped range around the point z0* at which the force F prevails. The interval Δz1 around the point z0* determines the difference ΔFF3 between the maximum and the minimum force of the third force interval ΔF3 including the force F, wherein the difference substantially corresponds to the difference ΔFF1, such that the bearing stiffness remains virtually unchanged despite guidance of the armature 1020 by the guide mechanisms. This advantageously has the result, however, that the distance interval of the armature 1020 can be significantly increased, without the difference between the maximum and the minimum force increasing in this interval. This results in a significantly lower average bearing stiffness of the weight force compensator. With further adaptation of the first and second force-distance characteristic curves 1003', 1014', an even flatter plateau can be formed in the resulting characteristic curve 1021', such that the bearing stiffness S3 is significantly reduced relative to the first distance interval Δz1 and, furthermore, the distance interval of the armature 1020 is significantly increased, without the difference between the maximum and the minimum force increasing in this interval, that is to say that in the resulting force-distance characteristic curve the difference ΔFF1 around the force F is assigned to a distance interval of greater than Δz1.

The weight force compensators used in EUV lithography for mounting EUV mirrors according to the embodiments described above are often dimensioned such that the first distance interval Δz1 is less than 3 mm, and that the third bearing stiffness is less than 2 N/mm.

Often, the movement of the armature perpendicular to the force F is restricted by transverse forces generated by the guide mechanisms in the direction perpendicular to the force F to less than 10% of the absolute value of the movement of the armature in the direction of the force. This results in maximum transverse movements of approximately 0.3 mm or less.

It can be seen in FIG. 18 that the optical element, e.g. a mirror of a lithographic EUV projection exposure apparatus, is supported by the weight force compensator only partly with regard to the weight force. Often, at least three weight force compensators support the optical element with regard to its weight force. In this case, the term "support" also encompasses the case where the optical element is held in a manner suspended from the weight force compensator. Furthermore, the optical element is supported at the force application point 1018 of the armature 120 directly or indirectly at least partly by a supporting device 1013. In this case, the supporting device 1013 has a lower stiffness in a direction perpendicular to the direction of the force F, that is to say in the x- and/or y-direction, than the guide mechanisms 1014 to 1018 in this direction. Alternatively, the supporting device 1018 has a higher stiffness in a direction perpendicular to the direction of the force F than the guide mechanisms in this direction. Which case is present depends on the stiffness of the guide element in the x- and/or y-direction, such that high and low stiffnesses for guide mechanisms 1014 to 1018 and supporting device 1018 are in each case always paired. In addition, the supporting device 1013 has a higher stiffness than 100 times the difference ΔFF3 in the direction of the force F, which results e.g. in a stiffness of more than 200 N.

The previous exemplary embodiments and embodiments essentially made use of the fact that the inner magnets of a compensation element are arranged with the same polarity, or else only include one magnet. Alternatively or additionally, at least one magnetic compensator element can also include at least two magnets having an orientation with opposite polarities. This could be achieved in a corresponding exemplary embodiment according to FIG. 19, for example, by e.g. the polarity of the upper magnet 1003 being reversed, i.e. by north being at the top in the case of this magnet. Given such polarity of the inner magnets 1003, 1004, this results e.g. in a characteristic curve 2100 illustrated in FIG. 26. If the armature is not deflected, than the force zero results on account of the symmetry. Upon deflection, the force firstly increases counter to the direction of the deflection, the arrangement behaving virtually like a spring with an approximately linear characteristic curve. After a maximum force has been reached, the force then decreases again down to zero. Upon exceeding the zero crossing and with increasing deflection of the armature, the force reverses and acts in the direction of the deflection. The above-described embodiments of magnetic compensation elements can also be operated with inner magnets of opposite polarity. However, the armature has to be deflected to a significant extent in order that the maximum force is generated. This usually involves a larger structural space. Furthermore, the maximum force is approximately 20% to 30% lower than in the case where the magnets have the same polarity. As a further embodiment of the disclosure, the magnetic compensation elements used can also be such elements having inner magnets of opposite polarity, in particular in combination with the above-described compensation elements and guide devices.

In the previous exemplary embodiments it is clearly evident that the features described for individual components can also be used conversely in specific cases in an obvious manner for the person skilled in the art, this also being encompassed by the disclosure content. By way of example, gravitation compensators represented as compressively loaded compensators can, in correspondingly suitable cases, also be used as tensile-loaded compensators, such that the optical element to be mounted therefore no longer bears on the corresponding compensators, but rather is held by the latter in a suspended fashion.

If individual components are represented as adjustable or manipulable, it is obvious to the person skilled in the art that equivalent components can also be configured as adjustable or manipulable in a similar manner. This applies, in particular, to manipulable magnets of the magnetic compensator elements.

Although the present disclosure has been described in detail on the basis of the accompanying exemplary embodiments, it is obvious to the person skilled in the art that the disclosure is not restricted to these exemplary embodiments, rather that modifications or changes are possible within the scope of the accompanying claims, without departing from the scope of protection. In particular, different combinations of all the features presented can be effected or individual features can be omitted in exemplary embodiments.

What is claimed is:

1. A weight force compensator configured to mount an optical element in a microlithography projection objective, the weight force compensator comprising:
   a first compensator element; and
   a second compensator element,
   wherein:
      the first compensator element is a first magnetic compensator element;
      the second compensator element comprises an element selected from the group consisting of a second magnetic compensator element and a mechanical spring compensator element;
      the weight force compensator is configured to at least partially compensate a weight force of the mounted optical element and to enable a change in a position of the mounted optical element; and
      when the mounted optical element changes position by less than 500 µm around an equilibrium position, a force-distance characteristic curve of the weight force compensator deviates by less than 0.25% of a force value in an equilibrium position.

2. The weight force compensator of claim 1, wherein, when the position of the mounted optical element changes by less than 250 µm around the equilibrium position, the force-distance characteristic curve of the weight force compensator deviates by less than 0.25% of the force value in the equilibrium position.

3. A projection objective, comprising:
   an optical element; and
   the weight force compensator of claim 1,
   wherein the optical element is mounted to the weight force compensator, and the projection objective is a microlithography projection objective.

4. The weight force compensator of claim 1, wherein, for compensated weight forces of ≥100 N, a change in the compensated weight force is less than or equal to 0.5 N when the mounted optical element changes position by ≥250 µm.

5. The weight force compensator of claim 1, wherein, for compensated weight forces of ≥200 N, a change in the compensated weight force is less than or equal to 0.5 N when the mounted optical element changes position by ≥250 µm.

6. The weight force compensator of claim 1, wherein, for compensated weight forces of ≥250 N, a change in the compensated weight force is less than or equal to 0.5 N when the mounted optical element changes position by ≥250 µm.

7. The weight force compensator of claim 1, wherein, for compensated weight forces of ≥300 N, a change in the compensated weight force is less than or equal to 0.5 N when the mounted optical element changes position by ≥250 µm.

8. The weight force compensator of claim 1, wherein, for compensated weight forces of ≥100 N, a change in the compensated weight force is less than or equal to 0.5 N when the mounted optical element changes position by ≥500 µm.

9. The weight force compensator of claim 1, wherein, for compensated weight forces of ≥100 N, a change in the compensated weight force is less than or equal to 0.5 N when the mounted optical element changes position by ≥750 µm.

10. The weight force compensator of claim 1, wherein, for compensated weight forces of ≥100 N, a change in the compensated weight force is less than or equal to 0.2 N when the mounted optical element changes position by ≥250 µm.

11. The weight force compensator of claim 1, wherein, for compensated weight forces of ≥100 N, a change in the compensated weight force is less than or equal to 0.1 N when the mounted optical element changes position by ≥250 µm.

12. The weight force compensator of claim 1, wherein, for compensated weight forces of ≥200 N, a change in the compensated weight force is less than or equal to 0.5 N when the optical element is mounted in a predominantly hydrogen-containing atmosphere.

13. The weight force compensator of claim 1, wherein, for compensated weight forces of ≥250 N, a change in the compensated weight force is less than or equal to 0.5 N when the optical element is mounted in a predominantly hydrogen-containing atmosphere.

14. The weight force compensator of claim 1, wherein, for compensated weight forces of ≥300 N, a change in the compensated weight force is less than or equal to 0.5 N when the optical element is mounted in a predominantly hydrogen-containing atmosphere.

15. The weight force compensator of claim 1, wherein, for compensated weight forces of ≥100 N, a change in the compensated weight force is less than or equal to 0.2 N when the optical element is mounted in a predominantly hydrogen-containing atmosphere.

16. The weight force compensator of claim 1, wherein, for compensated weight forces of ≥100 N, a change in the compensated weight force is less than or equal to 0.1 N when the optical element is mounted in a predominantly hydrogen-containing atmosphere.

17. The weight force compensator of claim 1, wherein, for compensated weight forces of ≥200 N, a change in the compensated weight force is less than or equal to 0.5 N when the optical element is mounted for ≥10 hours.

18. The weight force compensator of claim 1, wherein, for compensated weight forces of ≥250 N, a change in the compensated weight force is less than or equal to 0.5 N when the optical element is mounted for ≥10 hours.

19. The weight force compensator of claim 1, wherein, for compensated weight forces of ≥300 N, a change in the compensated weight force is less than or equal to 0.5 N when the optical element is mounted for ≥10 hours.

20. The weight force compensator of claim 1, wherein, for compensated weight forces of ≥100 N, a change in the compensated weight force is less than or equal to 0.2 N when the optical element is mounted for ≥10 hours.

21. The weight force compensator of claim 1, wherein, for compensated weight forces of ≥100 N, a change in the compensated weight force is less than or equal to 0.1 N when the optical element is mounted for ≥10 hours.

22. The projection objective of claim 2, wherein the projection objective is an EUV microlithography projection objective.

23. The projection objective of claim 2, wherein the optical element comprises a mirror.

24. The weight force compensator of claim 1, wherein:
   the second compensator element is the a second magnetic compensator element;
   the first magnetic compensator element has a first force-distance characteristic curve;
   the second magnetic compensator element has a second force-distance characteristic curve; and
   the first force-distance characteristic curve is different from the second force-distance characteristic curve.

25. The weight force compensator of claim 24, wherein the first and second magnetic compensator elements are arranged in series.

26. The weight force compensator of claim 24, wherein the first and second magnetic compensator elements are arranged in parallel.

27. The weight force compensator of claim 24, further comprising a rigid, non-magnetic element that couples the first and second magnetic compensator elements.

28. The weight force compensator of claim 27, further comprising a flux guiding element between the first and second magnetic compensator elements, wherein the flux guiding element surrounds the rigid, non-magnetic element.

29. The weight force compensator of claim 1, wherein the second compensator element is the mechanical spring compensator element.

30. The weight force compensator of claim 1, further comprising a counterweight and a deflection element, wherein the deflection element is configured to connect the counterweight and the optical element.

31. The weight force compensator of claim 1, further comprising a positioning element configured to change a position of the optical element independently of the first and second compensator elements.

32. The projection objective of claim 3, wherein:
   the first magnetic compensator element comprises:
      a first pair of magnets comprising a first magnet and a second magnet;
      a connecting element that connects the first and second magnets; and
      a second pair of magnets comprising a third magnet and a fourth magnet;
   the first pair of magnets is movable relative to the second pair of magnets; and
   the connecting is configured to keep a distance between the first and second magnets constant.

* * * * *